(12) United States Patent
Hong et al.

(10) Patent No.: US 11,637,255 B2
(45) Date of Patent: Apr. 25, 2023

(54) ORGANIC LIGHT EMITTING DIODE, LIGHTING DEVICE AND ORGANIC LIGHT EMITTING DISPLAY DEVICE

(71) Applicant: LG Display Co., Ltd., Seoul (KR)

(72) Inventors: Tae-Ryang Hong, Paju-si (KR); Hyong-Jong Choi, Paju-si (KR); Jun-Yun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 514 days.

(21) Appl. No.: 16/690,450

(22) Filed: Nov. 21, 2019

(65) Prior Publication Data

US 2020/0185633 A1 Jun. 11, 2020

(30) Foreign Application Priority Data

Dec. 5, 2018 (KR) .................. 10-2018-0155581

(51) Int. Cl.
| | | |
|---|---|---|
| *H01L 51/50* | (2006.01) | |
| *H01L 27/32* | (2006.01) | |
| *C09K 11/06* | (2006.01) | |
| *H01L 51/00* | (2006.01) | |

(52) U.S. Cl.
CPC .......... *H01L 51/5016* (2013.01); *C09K 11/06* (2013.01); *H01L 27/3244* (2013.01); *H01L 51/5044* (2013.01); *C09K 2211/1018* (2013.01); *C09K 2211/1029* (2013.01); *C09K 2211/185* (2013.01); *H01L 51/0067* (2013.01); *H01L 51/0072* (2013.01); *H01L 51/0073* (2013.01); *H01L 51/0074* (2013.01); *H01L 51/0085* (2013.01); *H01L 2251/5376* (2013.01)

(58) Field of Classification Search
None
See application file for complete search history.

(56) References Cited

U.S. PATENT DOCUMENTS

| | | | |
|---|---|---|---|
| 2006/0183394 A1* | 8/2006 | Kim .................... | H01L 51/5206 445/24 |
| 2016/0056393 A1* | 2/2016 | Oikawa ............... | H01L 51/5028 548/440 |

(Continued)

FOREIGN PATENT DOCUMENTS

CN 107256927 A 10/2017

OTHER PUBLICATIONS

Qi et al., High-efficiency phosphorescent organic light-emitting devices with low efficiency roll-off using a thermally activated delayed fluorescence material as host; Organic Electronics 36 (2016) 185-191 (Year: 2016).*

(Continued)

*Primary Examiner* — Gregory D Clark
(74) *Attorney, Agent, or Firm* — Morgan, Lewis & Bockius LLP

(57) ABSTRACT

An embodiment of the present disclosure provides an organic light emitting diode comprising a first electrode; a second electrode facing the first electrode; and a first emitting material layer including a first delayed fluorescent dopant and a first phosphorescent dopant and disposed between the first and second electrodes, wherein a percentage by weight of the first phosphorescent dopant with respect to the first delayed fluorescent dopant is equal to or less than 5.

19 Claims, 9 Drawing Sheets

(56) References Cited

U.S. PATENT DOCUMENTS

2017/0141323 A1  5/2017  Miyazaki et al.
2018/0047927 A1  2/2018  Zhang et al.

OTHER PUBLICATIONS

First Office Action dated Aug. 19, 2022, issued in corresponding Chinese Patent Application No. 201911220150.2.
Yige Qi et al., High-efficiency phosphorescent organic light-emitting devices with low efficiency roll-off using a thermally activated delayed fluorescence material as host, Organic Electronics, vol. 36, Sep. 2016, pp. 185-191.
Hiroki Uoyama et al., Highly efficient organic light-emitting diodes from delayed fluorescence, Nature, Dec. 13, 2012, pp. 234-240, vol. 492, Fukuoka, Japan.
Dongdong Zhang et al., Highly efficient hybrid warm white organic light-emitting diodes using a blue thermally activated delayed fluorescence emitter: exploiting the external heavy-atom effect, Light: Science & Applications, Jan. 2, 2015, pp. 1-7, vol. 4, Beijing, China.

* cited by examiner

ORGANIC LIGHT EMITTING DIODE, LIGHTING DEVICE AND ORGANIC LIGHT EMITTING DISPLAY DEVICE

The present application claims the priority benefit of Korean Patent Application No. 10-2018-0155581 filed in the Republic of Korea on Dec. 5, 2018, which is hereby incorporated by reference into the present application.

BACKGROUND

Technical Field

The present disclosure relates to an organic light emitting diode and more particularly to an organic light emitting diode having improved color continuity and a lighting device and an organic light emitting display device including the organic light emitting diode.

Discussion of the Related Art

As requests for a flat panel display device having a small occupied area have been increased, an organic light emitting display device including an organic light emitting diode (OLED) has been the subject of recent research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

To improve the emitting efficiency, the organic emitting layer may include a hole injection layer (HIL), a hole transporting layer (HTL), an emitting material layer (EML), an electron transporting layer (ETL) and an electron injection layer (EIL) sequentially stacked on the first electrode.

The hole from the first electrode is provided into the EML through the HIL and the HTL, and the electron from the second electrode is provided into the EML through the EIL and the ETL. The hole and electron are combined in the EML to generate exciton. The exciton is transited from the excited state into the ground state such that the light is emitted from the OLED.

On the other hand, a white-OLED (W-OLED) is used in a lighting device and/or a display device. For example, in the lighting device, the emission with width full width at half maximum (FWHM) to provide high color continuity is required.

To provide the W-OLED, a red emitting material, a green emitting material and a blue emitting material are necessary. However, a red delayed fluorescent material having wide FWHM is not developed.

Accordingly, development of an emitting material layer having high color continuity and high emitting efficiency is required.

SUMMARY

Accordingly, embodiments of the present disclosure are directed to an organic light emitting diode (OLED) and an organic light emitting display device including the same that substantially obviate one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting diode comprises a first electrode; a second electrode facing the first electrode; and a first emitting material layer including a first delayed fluorescent dopant and a first phosphorescent dopant and disposed between the first and second electrodes, wherein a percentage by weight of the first phosphorescent dopant with respect to the first delayed fluorescent dopant is equal to or less than 5.

In another aspect, an organic light emitting display device comprises a substrate; an organic light emitting diode on or over the substrate and including: a first electrode; a second electrode facing the first electrode; and a first emitting material layer including a first delayed fluorescent dopant and a first phosphorescent dopant and disposed between the first and second electrodes; and a thin film transistor disposed between the substrate and the organic light emitting diode and connected to the organic light emitting diode, wherein a percentage by weight of the first phosphorescent dopant with respect to the first delayed fluorescent dopant is equal to or less than 5.

In another aspect, a lighting device comprises a substrate; and an organic light emitting diode on or over the substrate and including: a first electrode; a second electrode facing the first electrode; and a first emitting material layer including a first delayed fluorescent dopant and a first phosphorescent dopant and disposed between the first and second electrodes, wherein a percentage by weight of the first phosphorescent dopant with respect to the first delayed fluorescent dopant is equal to or less than 5.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Reference will now be made in detail to embodiments of the present disclosure, examples of which are illustrated in the accompanying drawings.

Figure 1:
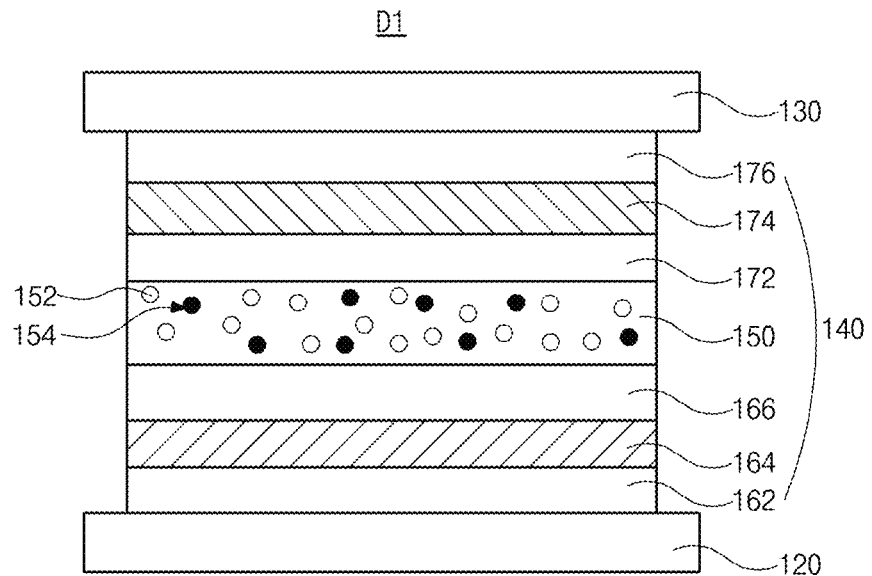
FIG. 1 is a schematic cross-sectional view of an OLED according to a first embodiment of the present disclosure.

FIG. 1 is a schematic cross-sectional view of an OLED according to a first embodiment of the present disclosure.

As shown in FIG. 1, an OLED D1 includes a first electrode 120, a second electrode 130 facing the first electrode 120 and an organic emitting layer 140 between the first and second electrodes 120 and 130. The organic emitting layer 140 includes an EML 150 including a delayed fluorescent dopant 152 having a first emission wavelength range and a phosphorescent dopant 154 having a second emission wavelength range.

The first electrode 120 includes a conductive material having a relatively high work function and serves as an anode. For example, the first electrode 120 may include a transparent conductive material, e.g., indium-tin-oxide (ITO) or indium-zinc-oxide (IZO), but it is not limited thereto.

When the OLED D1 is a top-emission type, a reflection electrode or a reflection layer may be formed under the first electrode 120. For example, the reflection electrode or the reflection layer may be formed of aluminum-palladium-copper (APC) alloy.

The second electrode 130 includes a conductive material having a relatively low work function and serves as a cathode. For example, the second electrode 130 may include magnesium (Mg) or aluminum-magnesium alloy (AlMg), but it is not limited thereto.

The organic emitting layer 140 includes the EML 150 positioned over the first electrode 120 and including the delayed fluorescent dopant 152 and the phosphorescent dopant 154. The delayed fluorescent dopant has the first emission wavelength range, and the phosphorescent dopant has the second emission wavelength range being different from the first emission wavelength range. A second maximum emission wavelength of the phosphorescent dopant may be greater than a first maximum emission wavelength of the delayed fluorescent dopant. For example, the first emission wavelength range may be a green wavelength range, and the second emission wavelength range may be a red wavelength range.

The delayed fluorescent dopant 152 may be represented by Formula 1.

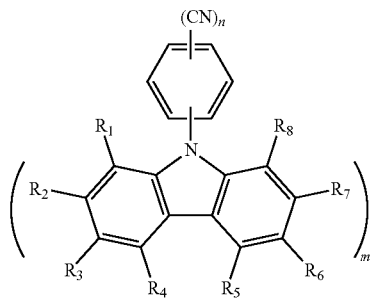

[Formula 1]

In Formula 1, each of $R_1$ to $R_8$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl, and amine. In addition, m is an integer of 2 to 5, and n is an integer of 1 to 3. m+n is less than or equal to 6.

For example, the delayed fluorescent dopant 152 may be selected from Formula 2.

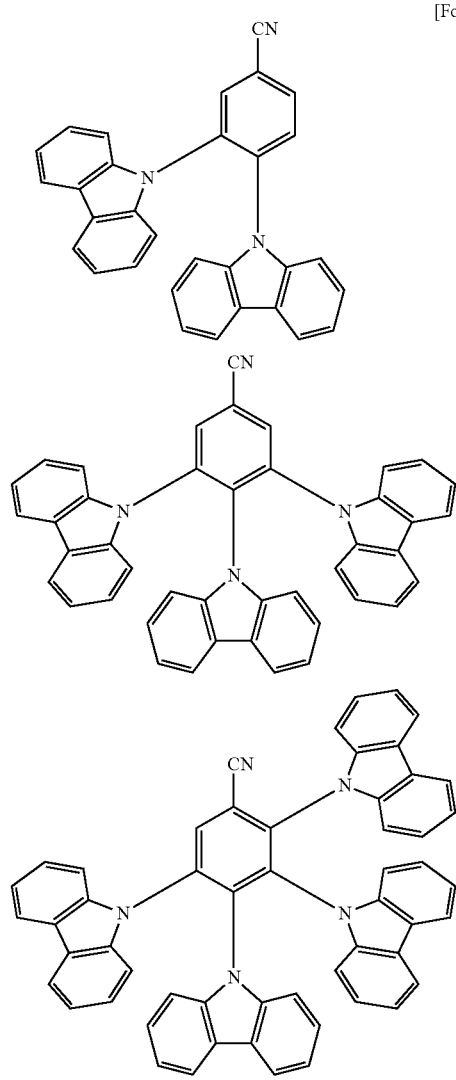

[Formula 2]

-continued
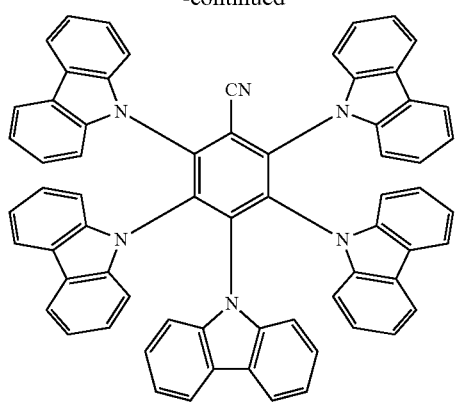
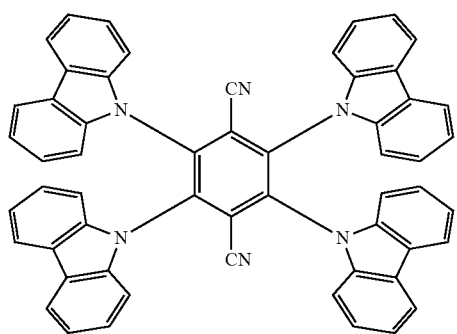
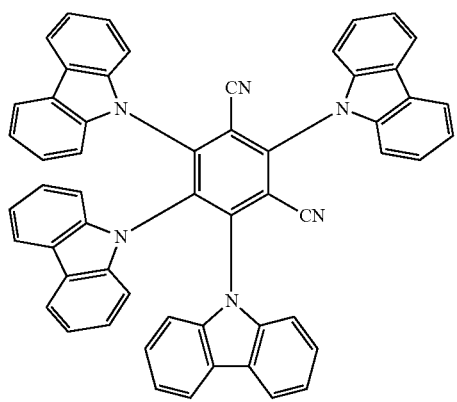
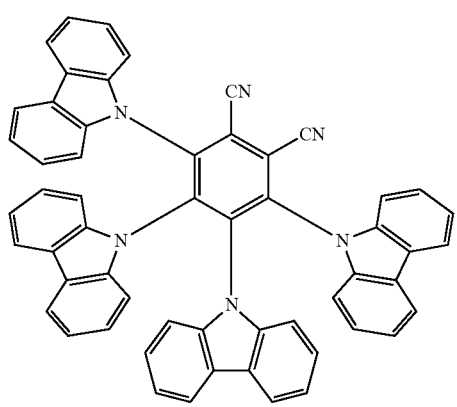
-continued
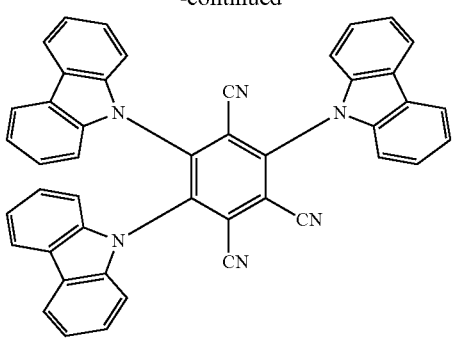
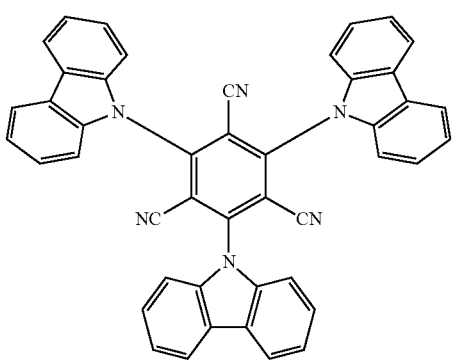
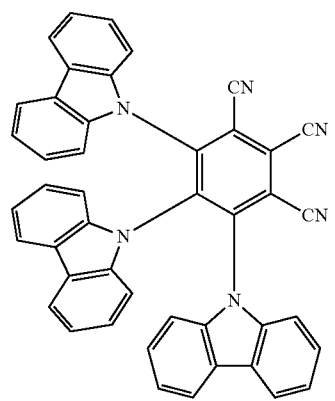

The delayed fluorescent dopant 152 may be represented by Formula 3.

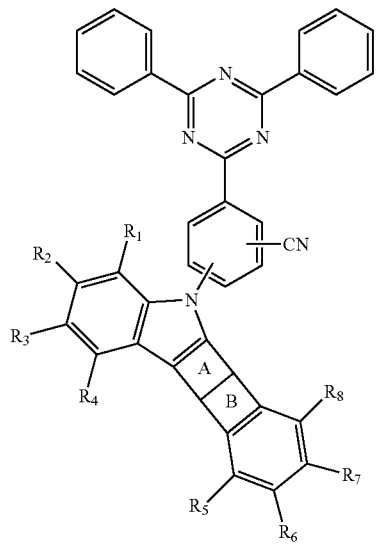

[Formula 3]

In Formula 3, each of $R_1$ to $R_8$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine.

In addition, A and B are represented by Formulas 3-1 and 3-2, respectively. Each of $R_9$ to $R_{15}$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine.

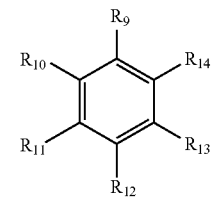

[Formula 3-1]

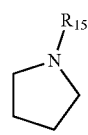

[Formula 3-2]

For example, the delayed fluorescent dopant 152 of Formula 3 may be selected from Formula 4.

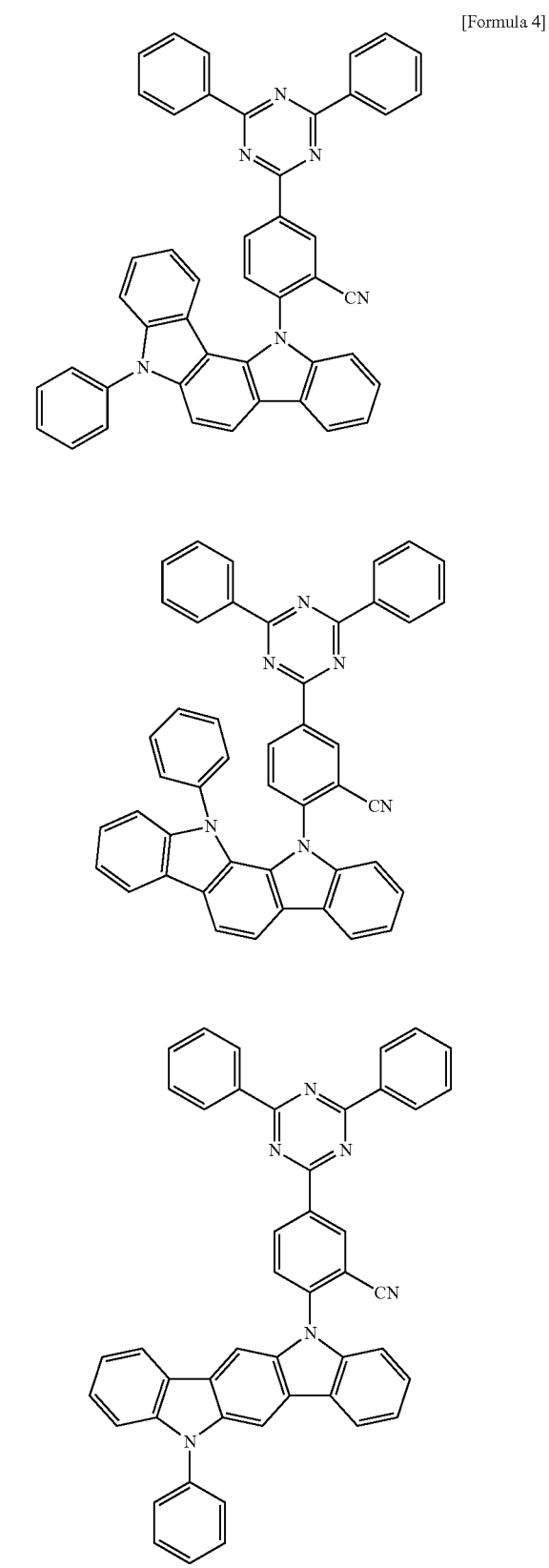

[Formula 4]

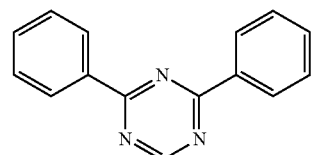
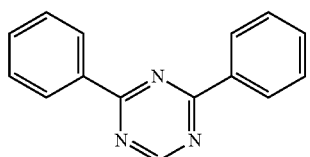
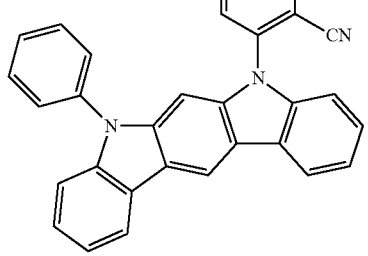
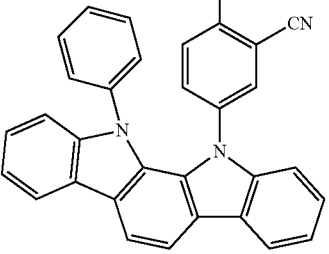
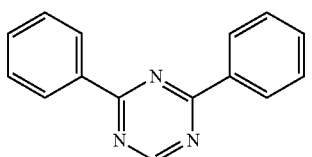
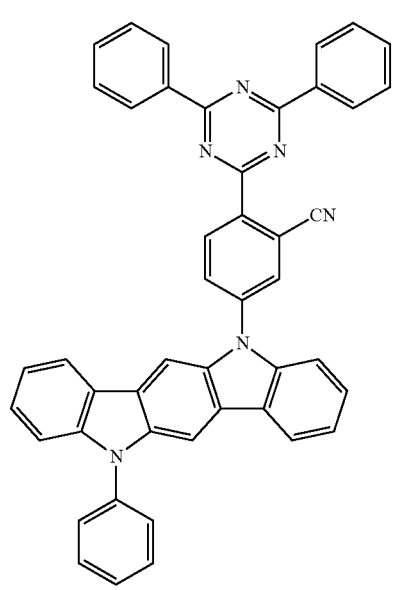
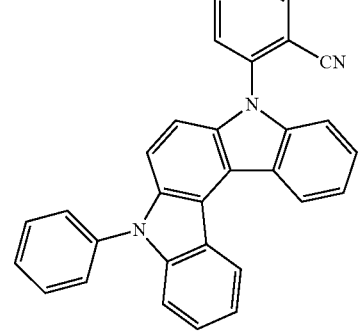
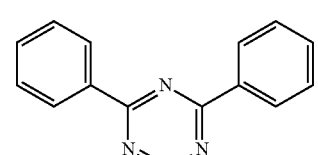
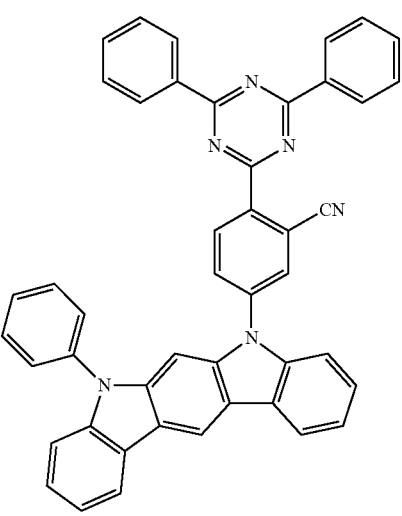
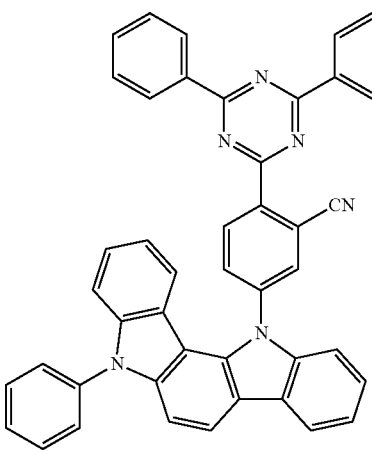

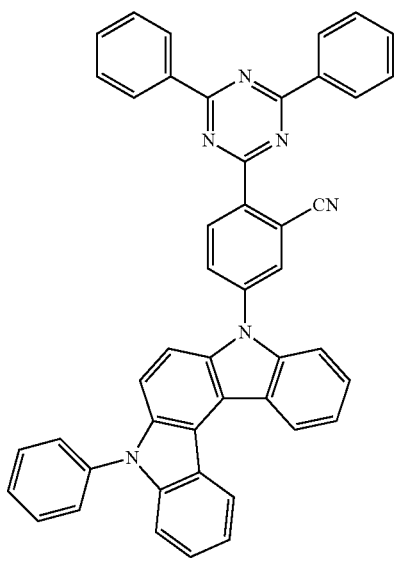 [SMILES: N#Cc1cc(-n2c3ccccc3c3c4c5ccccc5n(-c5ccccc5)c4ccc32)ccc1-c1nc(-c2ccccc2)nc(-c2ccccc2)n1]

The phosphorescent dopant 154 may be represented by Formula 5.

[Formula 5]

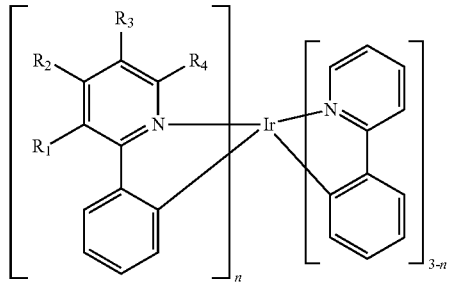

In Formula 5, each of $R_1$ to $R_4$ is independently selected from the group consisting of hydrogen, $C_1$-$C_{20}$ alkyl, $C_1$-$C_{20}$ alkoxy, C1 to C20 alkylsilyl, $C_6$-$C_{30}$ aryl, $C_5$-$C_{30}$ heteroaryl and amine, and $R_1$ and $R_2$ or $R_2$ and $R_3$ or $R_3$ and $R_4$ are combined to form a fused $C_6$-$C_{30}$ aromatic ring. In addition, n is an integer of 1 to 3.

For example, the phosphorescent dopant 154 may be selected from Formula 6.

[Formula 6]

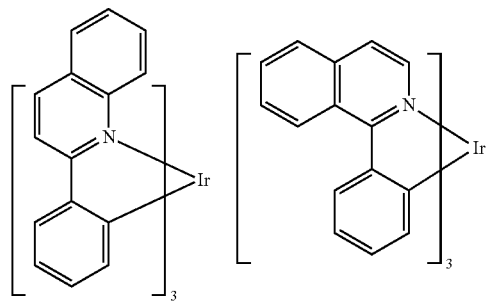

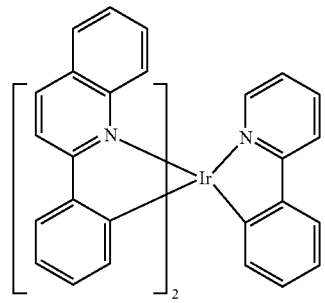

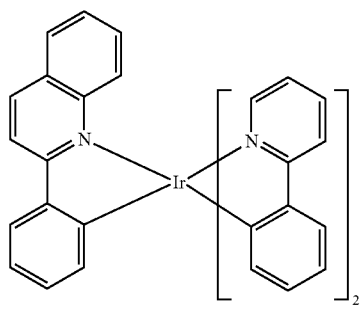

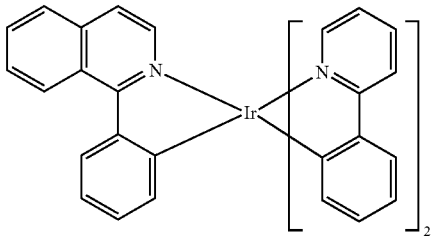

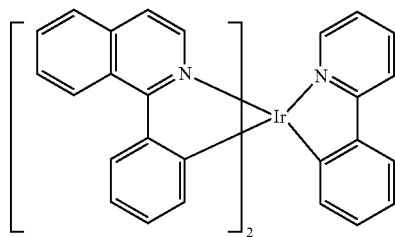

The phosphorescent dopant 154 has a percentage by weight being equal to or less than about 5 with respect to the delayed fluorescent dopant 152. For example, the percentage by weight of the phosphorescent dopant 154 with respect to the delayed fluorescent dopant 152 may be about 0.1 to 3.33, and preferably, about 0.1 to 1.0.

Although not shown, the EML 150 further includes a host. In the EML 150, the host has a percentage by weight of about 50 to 80.

With respect to the host, the delayed fluorescent dopant 152 may have a percentage by weight of about 20 to 70, and the phosphorescent dopant 154 may have a percentage by weight of about 0.1 to 2.

The host may be represented by Formula 7-1 or 7-2.

[Formula 7-1]

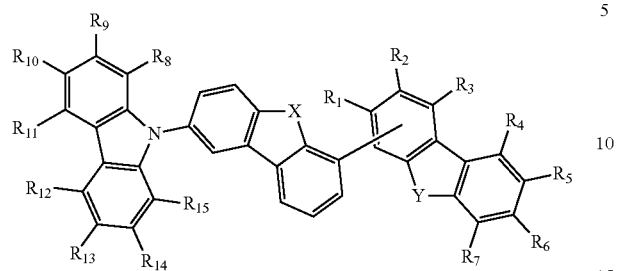

[Formula 7-2]

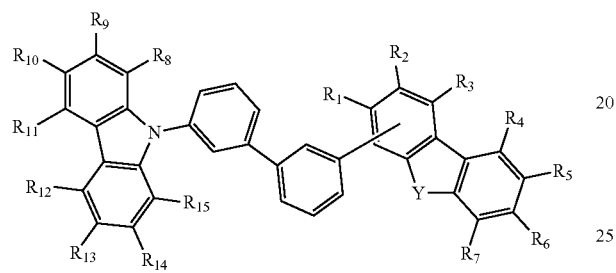

In Formula 7-1, X is O, S or NR, and R is $C_6$-$C_{30}$ aryl group. In Formulas 7-1 and 7-2, Y is O or S. In Formulas 7-1 and 7-2, each of $R_1$ to $R_{15}$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine.

For example, the host may be selected from Formula 8.

[Formula 8]

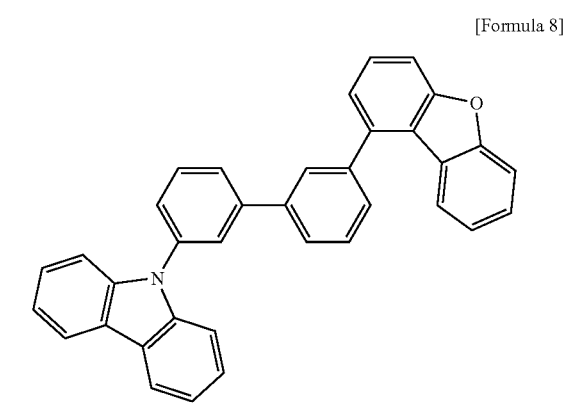

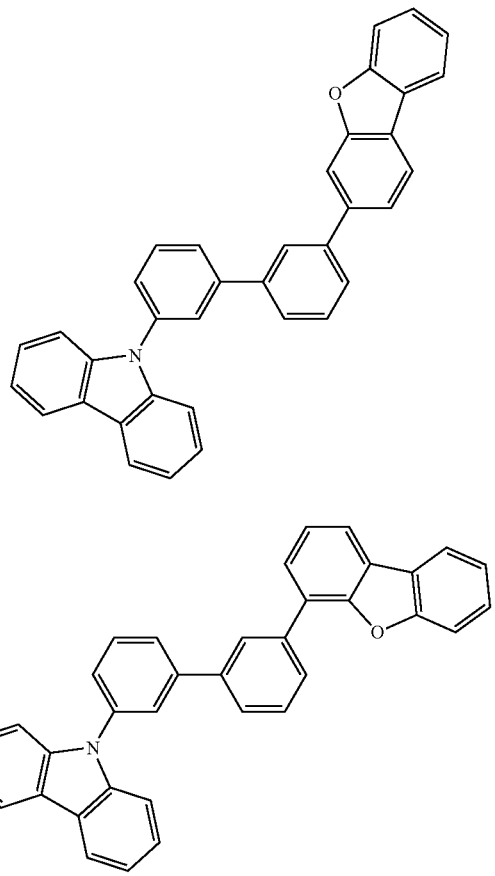

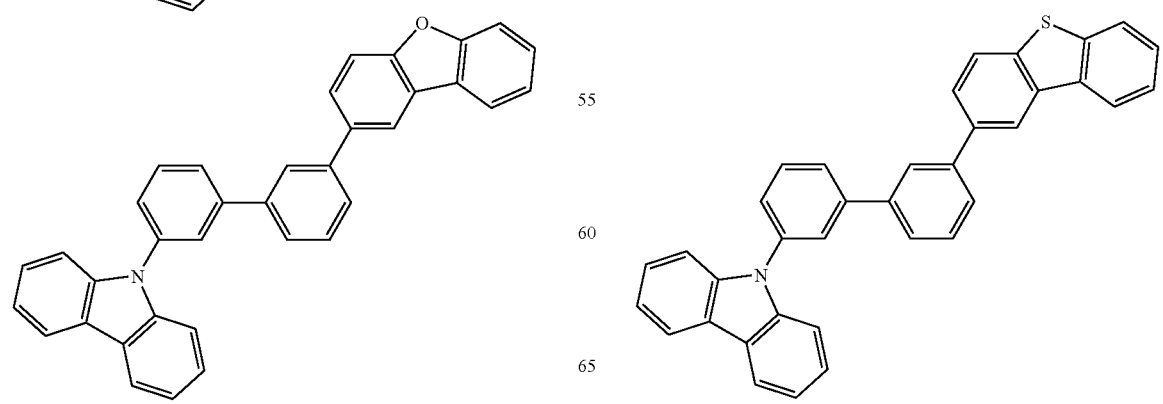

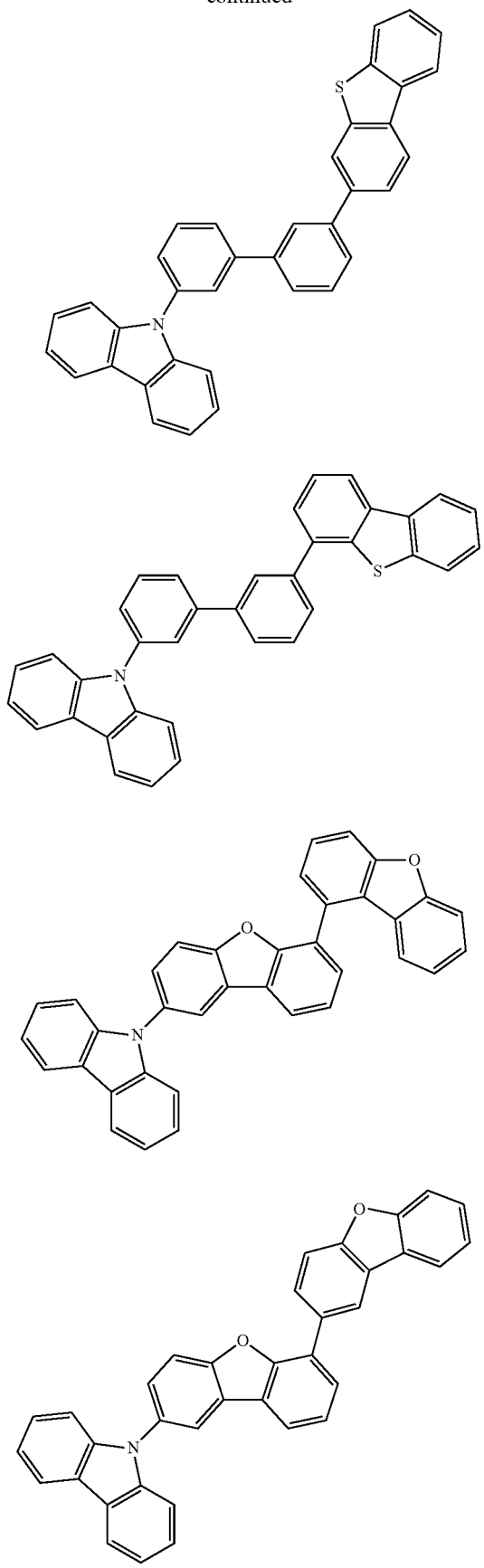
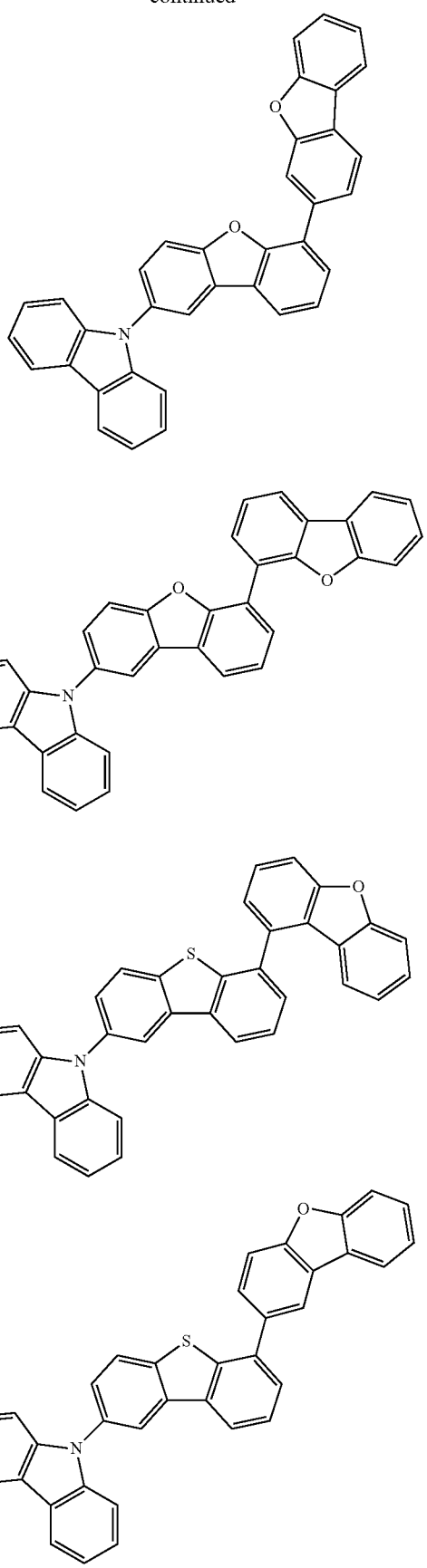

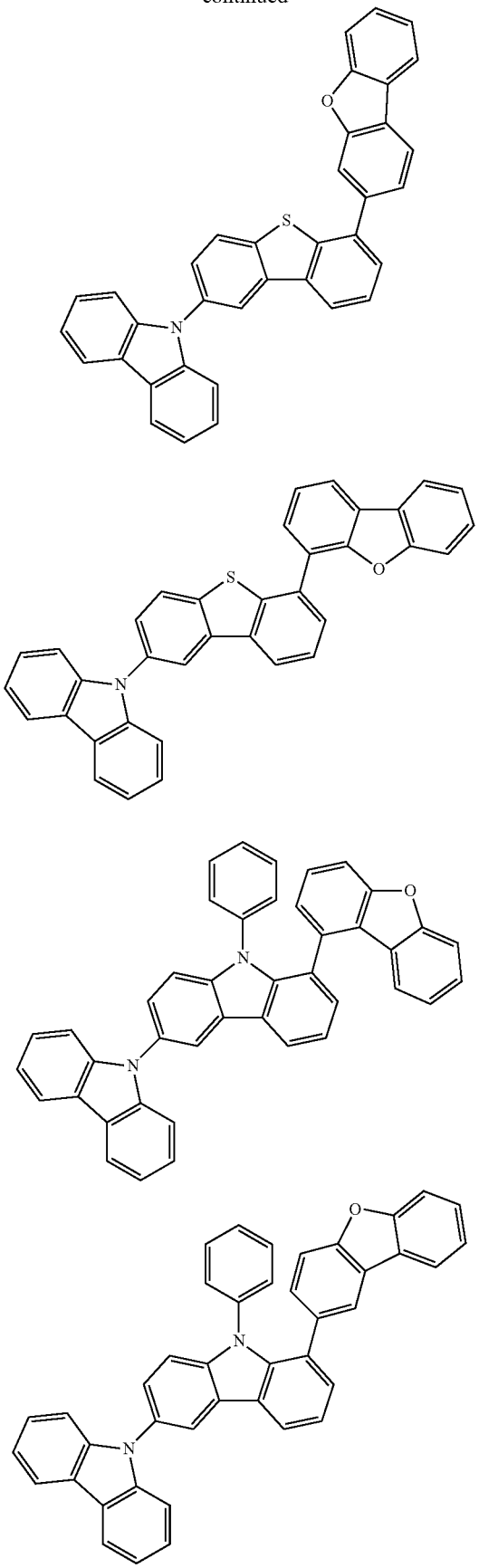

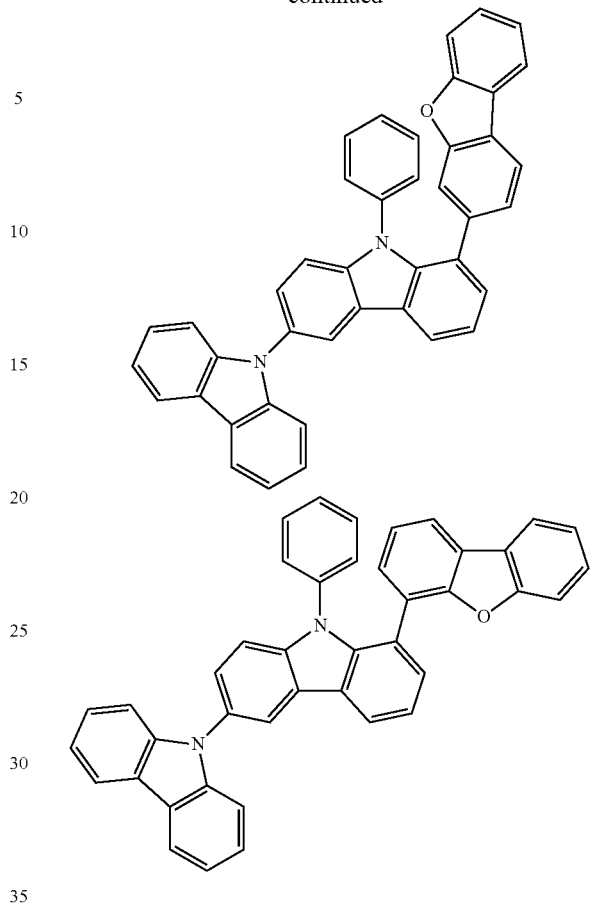

The organic emitting layer 140 further includes a hole transporting layer (HTL) 164 between the first electrode 120 and the EML 150, a hole injection layer (HIL) 162 between the first electrode 120 and the HTL 164, an electron transporting layer (ETL) 174 between the EML 150 and the second electrode 130 and an electron injection layer (EL) 176 between the ETL 174 and the second electrode 130. At least one of the HIL 162, the HTL 164, the ETL 174 and the EIL 176 may be omitted.

In addition, the organic emitting layer 140 may further include an electron blocking layer (EBL) 166 between the HTL 164 and the EML 150 and a hole blocking layer (HBL) 172 between the EML 150 and the ETL 174. At least one of the EBL 166 and the HBL 172 may be omitted.

The OLED D1 includes the delayed fluorescent dopant 152, which emits green light, and the phosphorescent dopant 154, which has smaller percentage by weight than the delayed fluorescent dopant 152 and emits red light, such that both of the green wavelength range light and the red wavelength range light are emitted.

Namely, in the OLED D1, high emitting efficiency and relatively wide FWHM are provided by the delayed fluorescent dopant 152, and both of the delayed fluorescent dopant 152 and the phosphorescent dopant 154 are involved in the light emission. As a result, the OLED D1 provide high emitting efficiency and improved color continuity.

Figure 2:
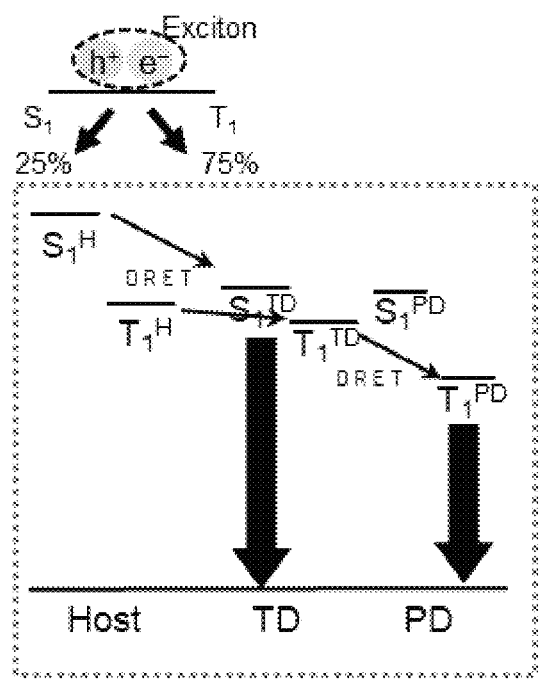
FIG. 2 is a schematic view illustrating an emission mechanism in an OLED of the embodiment of the present disclosure.

Referring to FIG. 2, which is a schematic view illustrating an emission mechanism in an OLED of the embodiment of the present disclosure, the exciton generated in the host "Host" is transferred into the delayed fluorescent dopant "TD" by Dexter Resonance Energy Transfer (DRET), and at least part of the triplet energy "T1" and the singlet energy "S1" of the delayed fluorescent dopant "TD" are transferred into the phosphorescent dopant "PD" by DRET. As a result, the red light is emitted from the phosphorescent dopant "PD".

When the percentage by weight of the phosphorescent dopant "PD" with respect to the delayed fluorescent dopant "TD" is above about 5, the energy of the delayed fluorescent dopant "TD" is rapidly transferred into the phosphorescent dopant "PD" such that the emission is generated in only the phosphorescent dopant "PD".

However, in the OLED D1, the percentage by weight of the phosphorescent dopant "PD" with respect to the delayed fluorescent dopant "TD" is equal to or less than about 5, preferably, 3.33, such that a part of the energy in the delayed fluorescent dopant "TD" remains in the delayed fluorescent dopant "TD". As a result, the emission is generated in the delayed fluorescent dopant "TD" as well as the phosphorescent dopant "PD".

In other words, when the EML 150 includes both of the delayed fluorescent dopant 152 and the phosphorescent dopant 154 with a specific condition of the percentage by weight, e.g., not more than 5 wt %, both of the delayed fluorescent dopant 152 and the phosphorescent dopant 154 are involved in the light emission such that the color continuity of the OLED D1 is improved.

[OLED]

An anode (ITO, 50 Å), an HIL (Formula 9, 7 Å), an HTL (Formula 10, 78 Å), an EBL (Formula 11, 15 Å), an EML (host(Formula 12) and dopant), an HBL (Formula 13, 10 Å), an ETL(Formula 14, 25 Å), an EIL (LiF) and a cathode (Al) are sequentially stacked to form the OLED.

1. Comparative Example 1 (Ref1)

The delayed fluorescent dopant of Formula 15 is used as the dopant to form the EML (35 Å). (host: 70 wt %, dopant: 30 wt %)

2. Comparative Example 2 (Ref2)

The phosphorescent dopant of Formula 16 is used as the dopant to form the EML (35 Å). (host: 95 wt %, dopant: 5 wt %)

3. Example 1 (Ex1)

The delayed fluorescent dopant of Formula 15 and the phosphorescent dopant of Formula 16 are used as the dopant to form the EML (35 Å). (host: 65 wt %, delayed fluorescent dopant: 30 wt %, phosphorescent dopant: 5 wt %)

4. Example 2 (Ex2)

The delayed fluorescent dopant of Formula 15 and the phosphorescent dopant of Formula 16 are used as the dopant to form the EML (35 Å). (host: 67 wt %, delayed fluorescent dopant: 30 wt %, phosphorescent dopant: 3 wt %)

5. Example 3 (Ex3)

The delayed fluorescent dopant of Formula 15 and the phosphorescent dopant of Formula 16 are used as the dopant to form the EML (35 Å). (host: 69 wt %, delayed fluorescent dopant: 30 wt %, phosphorescent dopant: 1 wt %)

6. Example 4 (Ex4)

The delayed fluorescent dopant of Formula 15 and the phosphorescent dopant of Formula 16 are used as the dopant to form the EML (35 Å). (host: 69.3 wt %, delayed fluorescent dopant: 30 wt %, phosphorescent dopant: 0.7 wt %)

7. Example 5 (Ex5)

The delayed fluorescent dopant of Formula 15 and the phosphorescent dopant of Formula 16 are used as the dopant to form the EML (35 Å). (host: 69.5 wt %, delayed fluorescent dopant: 30 wt %, phosphorescent dopant: 0.5 wt %)

8. Example 6 (Ex6)

The delayed fluorescent dopant of Formula 15 and the phosphorescent dopant of Formula 16 are used as the dopant to form the EML (35 Å). (host: 69.7 wt %, delayed fluorescent dopant: 30 wt %, phosphorescent dopant: 0.3 wt %)

9. Example 7 (Ex7)

The delayed fluorescent dopant of Formula 15 and the phosphorescent dopant of Formula 16 are used as the dopant to form the EML (35 Å). (host: 69.9 wt %, delayed fluorescent dopant: 30 wt %, phosphorescent dopant: 0.1 wt %)

10. Example 8 (Ex8)

The delayed fluorescent dopant of Formula 15 and the phosphorescent dopant of Formula 16 are used as the dopant to form the EML (35 Å). (host: 79.95 wt %, delayed fluorescent dopant: 20 wt %, phosphorescent dopant: 0.05 wt %)

11. Example 9 (Ex9)

The delayed fluorescent dopant of Formula 15 and the phosphorescent dopant of Formula 16 are used as the dopant to form the EML (35 Å). (host: 79.9 wt %, delayed fluorescent dopant: 20 wt %, phosphorescent dopant: 0.1 wt %)

12. Example 10 (Ex10)

The delayed fluorescent dopant of Formula 15 and the phosphorescent dopant of Formula 16 are used as the dopant to form the EML (35 Å). (host: 59.9 wt %, delayed fluorescent dopant: 40 wt %, phosphorescent dopant: 0.1 wt %)

13. Example 11 (Ex11)

The delayed fluorescent dopant of Formula 15 and the phosphorescent dopant of Formula 16 are used as the dopant to form the EML (30 Å). (host: 69.9 wt %, delayed fluorescent dopant: 30 wt %, phosphorescent dopant: 0.1 wt %)

14. Example 12 (Ex12)

The delayed fluorescent dopant of Formula 15 and the phosphorescent dopant of Formula 16 are used as the dopant to form the EML (40 Å). (host: 69.9 wt %, delayed fluorescent dopant: 30 wt %, phosphorescent dopant: 0.1 wt %)

The properties of the OLED of Comparative Examples 1 and 2 and Examples 1 to 12 are measured and listed in Table 1. In addition, a ratio ($I_G/I_R$) of the green light intensity ($I_G$) to the red light intensity ($I_R$) in the OLED of Examples 1 to 8 are listed in Table 2.

TABLE 1

|  | V | cd/A | LM/W | EQE [%] | cd/m² | CIE(x) | CIE(y) | FWHM [nm] |
|---|---|---|---|---|---|---|---|---|
| Ref1 | 2.94 | 62.26 | 66.64 | 19.46 | 747.2 | 0.3671 | 0.5669 | 99 |
| Ref2 | 3.12 | 29.12 | 29.32 | 23.28 | 349.5 | 0.6497 | 0.3479 | 63 |
| Ex1 | 3.14 | 29.18 | 29.42 | 23.11 | 352.1 | 0.6500 | 0.3472 | 63 |
| Ex2 | 2.80 | 33.20 | 37.27 | 21.81 | 398.5 | 0.6064 | 0.3826 | 61 |
| Ex3 | 3.39 | 45.22 | 41.95 | 21.76 | 542.8 | 0.5052 | 0.4584 | 58 |
| Ex4 | 3.45 | 38.93 | 35.49 | 22.29 | 467.3 | 0.5555 | 0.4197 | 61 |
| Ex5 | 3.38 | 47.78 | 44.35 | 21.00 | 573.5 | 0.4789 | 0.4791 | 132 |
| Ex6 | 3.02 | 52.24 | 54.39 | 21.25 | 627.1 | 0.4615 | 0.4953 | 140 |
| Ex7 | 3.22 | 56.85 | 55.40 | 21.42 | 682.4 | 0.4247 | 0.5154 | 149 |
| Ex8 | 2.95 | 53.00 | 56.42 | 20.96 | 530 | 0.4553 | 0 5014 | 143 |
| Ex9 | 3.10 | 53.74 | 54.50 | 19.57 | 645.1 | 0.4261 | 0.5221 | 142 |
| Ex10 | 3.18 | 46.35 | 45.73 | 18.94 | 556.4 | 0.4632 | 0.4956 | 142 |
| Ex11 | 2.92 | 44.38 | 47.81 | 16.07 | 532.7 | 0.4153 | 0.5307 | 140 |
| Ex12 | 3.34 | 62.84 | 59.05 | 18.40 | 754.3 | 0.3673 | 0.5857 | 132 |

TABLE 2

|  | $W_{PD}/W_{TD}$ | $I_G/I_R$ |
|---|---|---|
| Ex1 | 16.67% | 0.0 |
| Ex2 | 10% | 0.1 |
| Ex3 | 3.33% | 0.2 |
| Ex4 | 2.33% | 0.4 |
| Ex5 | 1.67% | 0.6 |
| Ex6 | 1.0% | 0.8 |
| Ex7 | 0.33% | 1.0 |
| Ex8 | 0.25% | 1.1 |

Figure 3A:
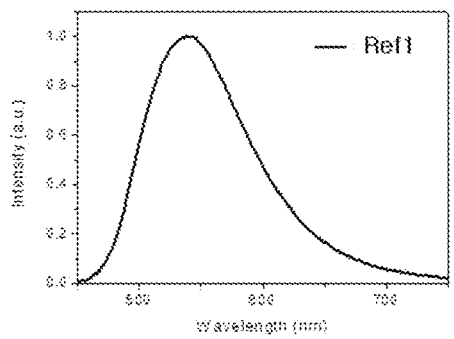
FIGS. 3A to 3N are graphs showing an emission spectrum in the OLED of the first embodiment of the present disclosure.
Figure 3B:
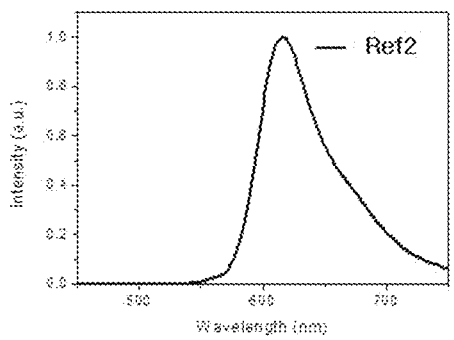
Figure 3C:
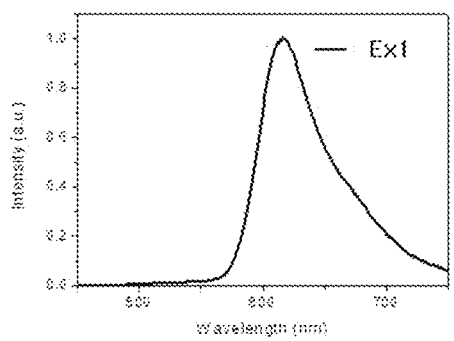
Figure 3D:
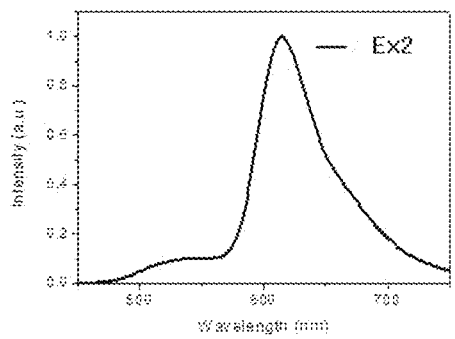
Figure 3E:
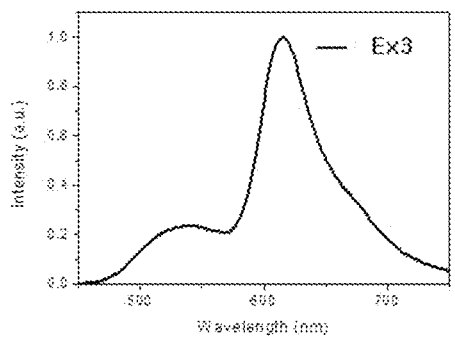
Figure 3F:
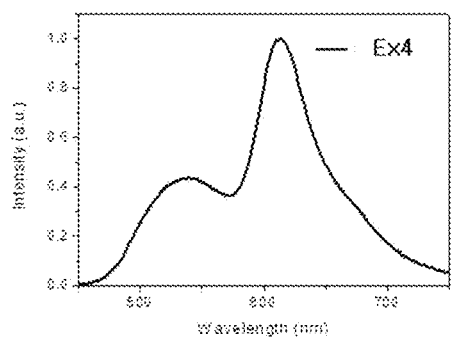
Figure 3G:
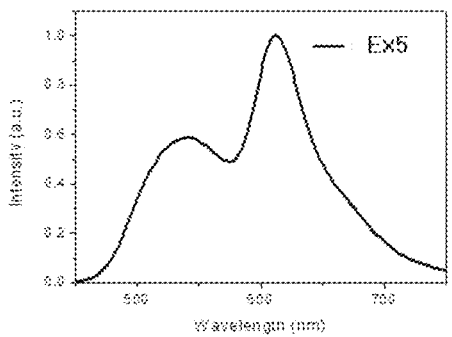
Figure 3H:
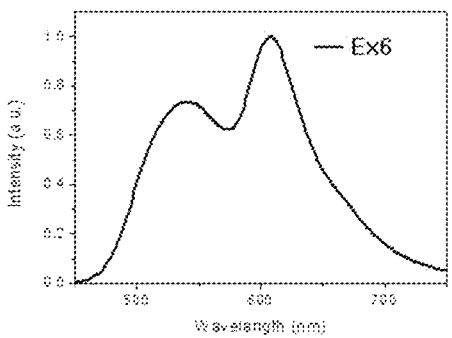
Figure 3I:
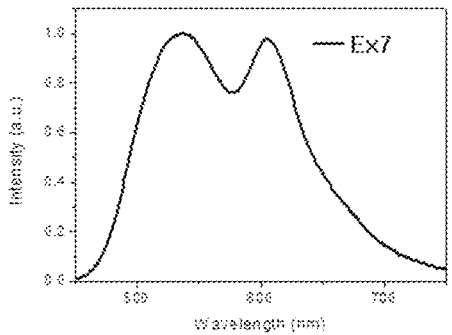
Figure 3J:
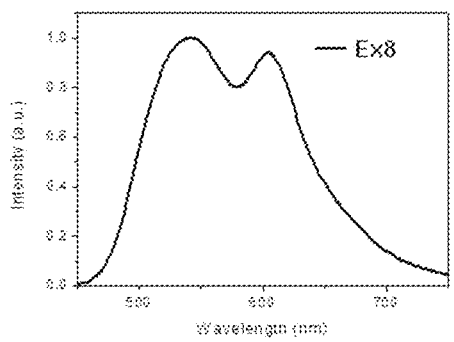
Figure 3K:
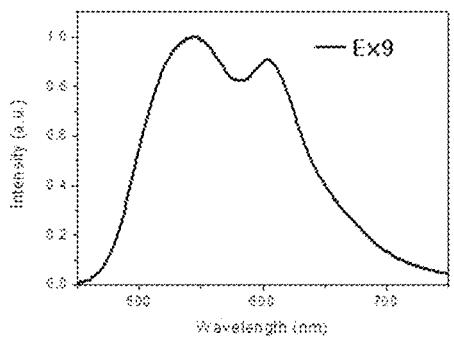
Figure 3L:
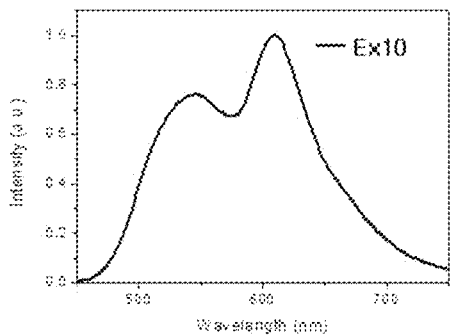
Figure 3M:
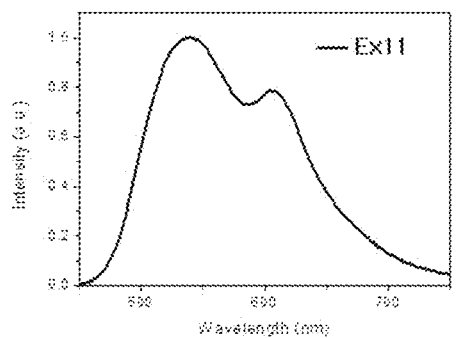
Figure 3N:
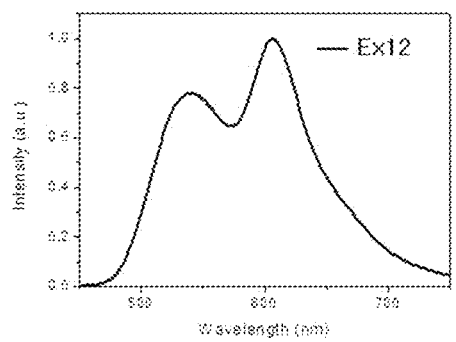

As shown in Table 1 and FIGS. 3A to 3N, when the phosphorescent dopant has the percentage by weight being equal to or less than about 3, the light emission is generated from the delayed fluorescent dopant and the phosphorescent dopant.

However, to provide sufficient or desired color continuity, the green light intensity by the delayed fluorescent dopant is necessary to be above about 20% with respect to the red light intensity by the phosphorescent dopant. Accordingly, the percentage by weight of the phosphorescent dopant with respect to the delayed fluorescent dopant is equal to or less than about 5, and preferably equal to less than about 3.3. (Examples 3 to 8)

To use the OLED for the lighting device, the light from the OLED is required to have a color temperature of about 3000K to 4000K. To meet the color temperature condition, a ratio ($I_G/I_R$) of the green light intensity ($I_G$) to the red light intensity ($I_R$) is required to have a range of about 0.8 to 1.0. On the other hand, to use the OLED for the display device such as TV, the light from the OLED is required to have a color temperature of about 7000K to 10000K.

Accordingly, in the OLED of the present disclosure, the weight % ratio ($W_{TD}/W_{PD}$) of the phosphorescent dopant to the delayed fluorescent dopant is equal to or less than 0.1, and preferably, about 0.1 to 1.0.

The percentage by weight of the delayed fluorescent dopant with respect to the host may be about ¼ to ³/₇. As shown in Examples 7, 9 and 10, as the percentage by weight of the delayed fluorescent dopant is increased, the efficiency of the OLED is decreased.

As mentioned above, in the OLED D1 of the present disclosure, the EML 150 includes the delayed fluorescent dopant 152 and the phosphorescent dopant 154, which have a difference in an emission wavelength range, and the phosphorescent dopant 154 has a percentage by weight being equal to or less than about 5 with respect to the delayed fluorescent dopant 152. As a result, the color continuity of the OLED D1 is increased.

Figure 4:
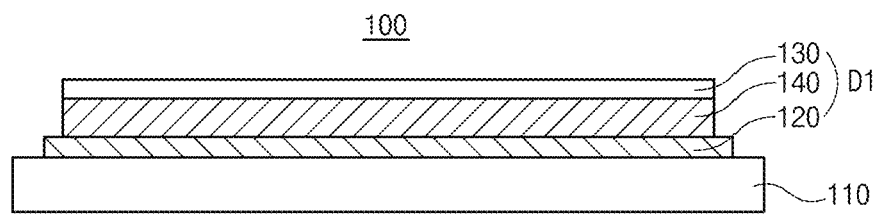
FIG. 4 is a schematic cross-sectional view of a lighting device according to the present disclosure.

FIG. 4 is a schematic cross-sectional view of a lighting device according to the present disclosure.

As shown in FIG. 4, the lighting device 100 includes a substrate 110 and an OLED D1 on or over the substrate 110. The OLED D1 includes a first electrode 120, an organic emitting layer 140 and a second electrode 130.

In FIG. 4, the organic emitting layer 140 and the second electrode 130 are sequentially stacked on the first electrode 120. Alternatively, the organic emitting layer 140 and the first electrode 120 may be sequentially stacked on the second electrode 130.

As mentioned above, in the OLED D1 of the present disclosure, the EML 150 includes the delayed fluorescent dopant 152 and the phosphorescent dopant 154, which have a difference in an emission wavelength range, and the phosphorescent dopant 154 has a percentage by weight being equal to or less than about 5 with respect to the delayed fluorescent dopant 152. As a result, the color continuity of the OLED D1 is increased, and high quality lighting device 100 is provided.

Figure 5:
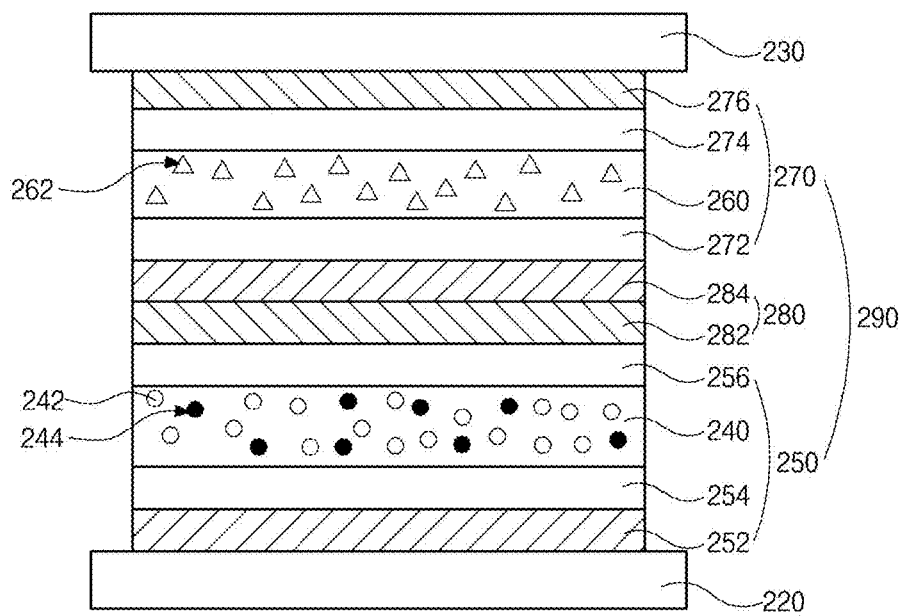
FIG. 5 is a schematic cross-sectional view of an OLED according to a second embodiment of the present disclosure.

FIG. 5 is a schematic cross-sectional view of an OLED according to a second embodiment of the present disclosure.

As shown in FIG. 5, the OLED D2 includes a first electrode 220, a second electrode 230, an organic emitting layer 290 between the first and second electrodes 220 and 230. The organic emitting layer 290 includes a first emitting part 250 including a first EML 240, a second emitting part 270 including a second EML 260 and a charge generation layer (CGL) 280 between the first and second emitting parts 250 and 270.

The first electrode 220 is the anode for injecting a hole and includes a high work function conductive material, e.g., ITO or IZO. The second electrode 230 is the cathode for injecting an electron and includes a low work function conductive material, e.g., Al, Mg or Al—Mg alloy.

The CGL 280 is positioned between the first and second emitting parts 250 and 270. Namely, the first emitting part 250, the CGL 280 and the second emitting part 270 are sequentially stacked on the first electrode 220. In other words, the first emitting part 250 is positioned between the first electrode 220 and the CGL 280, and the second emitting part 270 is positioned between the second electrode 230 and the CGL 280.

The first emitting part 250 may include an HIL 252, a first HTL 254, a first EML 240 and a first ETL 256 sequentially stacked on the first electrode 220. Namely, the HIL 252 and the first HTL 254 are positioned between the first electrode 220 and the first EML 240. The HIL 252 is positioned between the first electrode 220 and the first HTL 254, and the first HTL 254 is positioned between the HIL 252 and the first EML 240. In addition, the first ETL 256 is positioned between the first EML 240 and the CGL 280.

The first EML 240 includes a delayed fluorescent dopant 242 and a phosphorescent dopant 244. The delayed fluorescent dopant 242 has the first emission wavelength range, and the phosphorescent dopant 244 has the second emission wavelength range being different from the first emission wavelength range. For example, the first emission wavelength range may be a green wavelength range, and the second emission wavelength range may be a red wavelength range.

The delayed fluorescent dopant 242 may be represented by Formula 1 or Formula 3, and the phosphorescent dopant 244 may be represented by Formula 5.

The percentage by weight of the phosphorescent dopant 244 with respect to the delayed fluorescent dopant 242 is equal to or less than about 5. For example, the percentage by weight of the phosphorescent dopant 244 with respect to the delayed fluorescent dopant 242 may be in a range of about 0.1 to 3.33, preferably about 0.1 to 1.0.

Although not shown, the first EML 240 may further include a host. The host may have a percentage by weight of about 50 to 80 in the first EML 240 and may be represented by Formula 7-1 or Formula 7-2.

The second emitting part 270 may include a second HTL 272, a second EML 260, a second ETL 274 and an EIL 276. The second HTL 272 is positioned between the CGL 280 and the second EML 260, and the second ETL 274 is positioned between the second EML 260 and the second electrode 230. In addition, the EIL 276 is positioned between the second ETL 274 and the second electrode 230.

The second EML 260 includes a blue dopant 262. The blue dopant 262 has an emission wavelength range being shorter than the delayed fluorescent dopant 242 and the phosphorescent dopant 244 in the first EML 240. For example, the blue dopant 262 may be one of a fluorescent compound, a phosphorescent compound and a delayed fluorescent dopant.

Although not shown, the second EML 260 may further include a host. The blue dopant 262 may have a percentage by weight of about 1 to 40, preferably 3 to 40, with respect to the host.

The CGL 280 is positioned between the first emitting part 250 and the second emitting part 270. Namely, the first and second emitting parts 250 and 270 are connected by the CGL 280. The CGL 280 may be a P-N junction type CGL including an N-type CGL 282 and a P-type CGL 284.

The N-type CGL 282 is positioned between the first ETL 256 and the second HTL 272, and the P-type CGL 284 is positioned between the N-type CGL 282 and the second HTL 272.

In FIG. 5, the first EML 240, which is adjacent to the first electrode 220 as the anode, includes the delayed fluorescent dopant 242 as a green dopant and the phosphorescent dopant 244 as a red dopant, and the second EML 260, which is adjacent to the second electrode 230 as the cathode, includes the blue dopant 262. Alternatively, the first EML 240, which is adjacent to the first electrode 220 as the anode, may include the blue dopant, and the second EML 260, which is adjacent to the second electrode 230 as the cathode, may include the delayed fluorescent dopant as a green dopant and the phosphorescent dopant as a red dopant.

In the OLED D2, the first EML 240 in the first emitting part 250 includes the delayed fluorescent dopant 242 as a green dopant and the phosphorescent dopant 244 as a red dopant, and the percentage by weight of the phosphorescent dopant 244 with respect to the delayed fluorescent dopant 242 is equal to or less than about 5, preferably 3.33. As a result, the light of a red wavelength range and the light of a green wavelength range are provided from the first emitting part 250.

Accordingly, the OLED D2 including the first emitting part 250 and the second emitting part 270, which includes the blue dopant 262, emits the white light.

Figure 6:
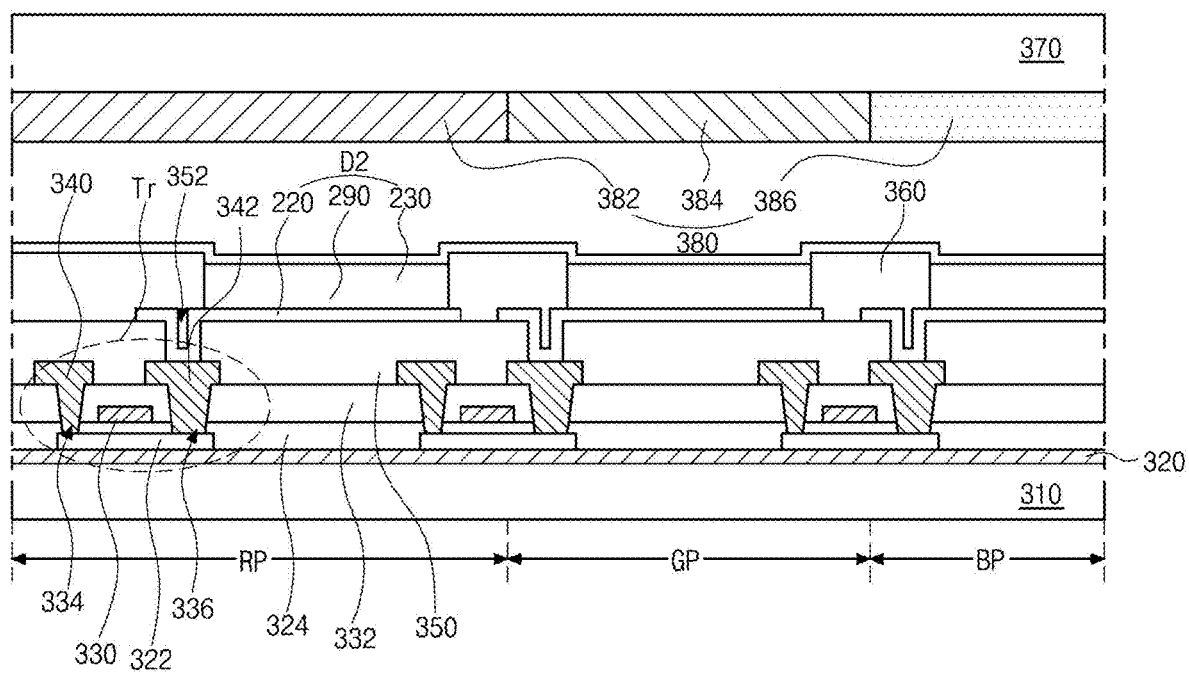
FIG. 6 is a schematic cross-sectional view of a display device according to the present disclosure.

FIG. 6 is a schematic cross-sectional view of a display device according to the present disclosure. The display device of FIG. 6 includes an OLED according to the second embodiment of FIG. 5.

As shown in FIG. 6, the display device 300 includes a first substrate 310, where a red pixel RP, a green pixel GP and a blue pixel BP are defined, a second substrate 370, which faces the first substrate 310, an OLED D2 between the first and second substrates 310 and 370 and a color filter layer 380 between the OLED D2 and the second substrate 370. The OLED D2 provides white light toward the color filter layer 380.

Each of the first and second substrates 310 and 370 may be a glass substrate or a plastic substrate. For example, each of the first and second substrates 310 and 370 may be a polyimide substrate.

A buffer layer 320 is formed on the substrate, and a thin film transistor (TFT) Tr is formed on the buffer layer 320 in each of the red, green and blue pixels RP, GP and BP. The buffer layer 320 may be omitted.

A semiconductor layer 322 is formed on the buffer layer 320. The semiconductor layer 322 may include an oxide semiconductor material or polycrystalline silicon.

When the semiconductor layer 322 includes the oxide semiconductor material, a light-shielding pattern (not shown) may be formed under the semiconductor layer 322. The light to the semiconductor layer 322 is shielded or blocked by the light-shielding pattern such that thermal degradation of the semiconductor layer 322 can be prevented. On the other hand, when the semiconductor layer 322 includes polycrystalline silicon, impurities may be doped into both sides of the semiconductor layer 322.

A gate insulating layer 324 is formed on the semiconductor layer 322. The gate insulating layer 324 may be formed of an inorganic insulating material such as silicon oxide or silicon nitride.

A gate electrode 330, which is formed of a conductive material, e.g., metal, is formed on the gate insulating layer 324 to correspond to a center of the semiconductor layer 322.

In FIG. 6, the gate insulating layer 324 is formed on an entire surface of the first substrate 310. Alternatively, the gate insulating layer 324 may be patterned to have the same shape as the gate electrode 330.

An interlayer insulating layer 332, which is formed of an insulating material, is formed on the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

The first and second contact holes 334 and 336 are formed through the gate insulating layer 324. Alternatively, when the gate insulating layer 324 is patterned to have the same shape as the gate electrode 330, the first and second contact holes 334 and 336 is formed only through the interlayer insulating layer 332.

A source electrode 340 and a drain electrode 342, which are formed of a conductive material, e.g., metal, are formed on the interlayer insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr. The TFT Tr serves as a driving element.

In the TFT Tr, the gate electrode 330, the source electrode 340, and the drain electrode 342 are positioned over the semiconductor layer 322. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 350, which includes a drain contact hole 352 exposing the drain electrode 342 of the TFT Tr, is formed to cover the TFT Tr.

A first electrode 220, which is connected to the drain electrode 342 of the TFT Tr through the drain contact hole 352, is separately formed in each pixel. The first electrode 220 may be an anode and may be formed of a conductive material having a relatively high work function. For example, the first electrode 220 may be formed of a transparent conductive material such as ITO or IZO.

A reflection electrode or a reflection layer may be formed under the first electrode 220. For example, the reflection electrode or the reflection layer may be formed of aluminum-palladium-copper (APC) alloy.

A bank layer 360 is formed on the passivation layer 350 to cover an edge of the first electrode 220. Namely, the bank layer 360 is positioned at a boundary of the pixel and exposes a center of the first electrode 220 in the pixel. The bank layer 360 may be omitted.

An organic emitting layer 290 is formed on the first electrode 220. Referring to FIG. 5, the organic emitting layer 290 includes the first emitting part 250 including the first EML 240 and the second emitting part 270 including the second EML 260. For example, the first EML 240 includes the delayed fluorescent dopant 242 as a green dopant and the phosphorescent dopant 244 as a red dopant.

A second electrode 230 is formed over the first substrate 310 where the organic emitting layer 290 is formed. The second electrode 230 covers an entire surface of the display area and may be formed of a conductive material having a relatively low work function to serve as a cathode. For example, the second electrode 164 may be formed of aluminum (Al), magnesium (Mg) or Al—Mg alloy.

Since the light from the organic emitting layer 290 is incident to the color filter layer 380 through the second electrode 230, the second electrode 230 has thin profile such that the light passes through the second electrode 230.

The first electrode 220, the organic emitting layer 290 and the second electrode 230 constitute the OLED D2.

The color filter layer 380 is positioned on or over the OLED D2 and includes a red color filter pattern 382, a green color filter pattern 384 and a blue color filter pattern 386 respectively corresponding to the red pixel RP, the green pixel GP and the blue pixel BP.

Although not shown, the color filter layer 380 may be attached to the OLED D2 by an adhesive layer. Alternatively, the color filter layer 380 may be directly formed on the OLED D2.

In addition, an encapsulation film may be formed to cover the OLED D2 to prevent penetration of moisture into the OLED D2. For example, the encapsulation film may include a first inorganic insulating layer, an organic insulating layer and a second inorganic insulating layer sequentially stacked, but it is not limited thereto. The encapsulation film may be omitted.

Moreover, a polarization plate for reducing an ambient light reflection may be disposed at an outer side of the second substrate 370. For example, the polarization plate may be a circular polarization plate. The polarization plate may be omitted.

In FIG. 6, the light from the OLED D2 is provided through the second electrode 230, and the color filter layer 380 is disposed over the OLED D2. Alternatively, the light from the OLED D2 may be provided through the first electrode 220, and the color filter layer 380 may be disposed between the OLED D2 and the first substrate 310.

In addition, in FIG. 6, the first electrode 220 is connected to the TFT Tr. Alternatively, the second electrode 230 may be positioned between the TFT Tr and the first electrode 220 and may be connected to the TFT Tr.

The white light from the OLED D2 passes through the red color filter pattern 382 in the red pixel RP, the green color filter pattern 384 in the green pixel GP and the blue color filter pattern 386 in the blue pixel such that the red light, the green light and the blue light are provided from the red pixel RP, the green pixel GP and the blue pixel BP, respectively.

In FIG. 6, the OLED D2 is used to the display device 300 including the red, green and blue pixels RP, GP and BP. Alternatively, the OLED D2 is also used to the lighting device.

Figure 7:
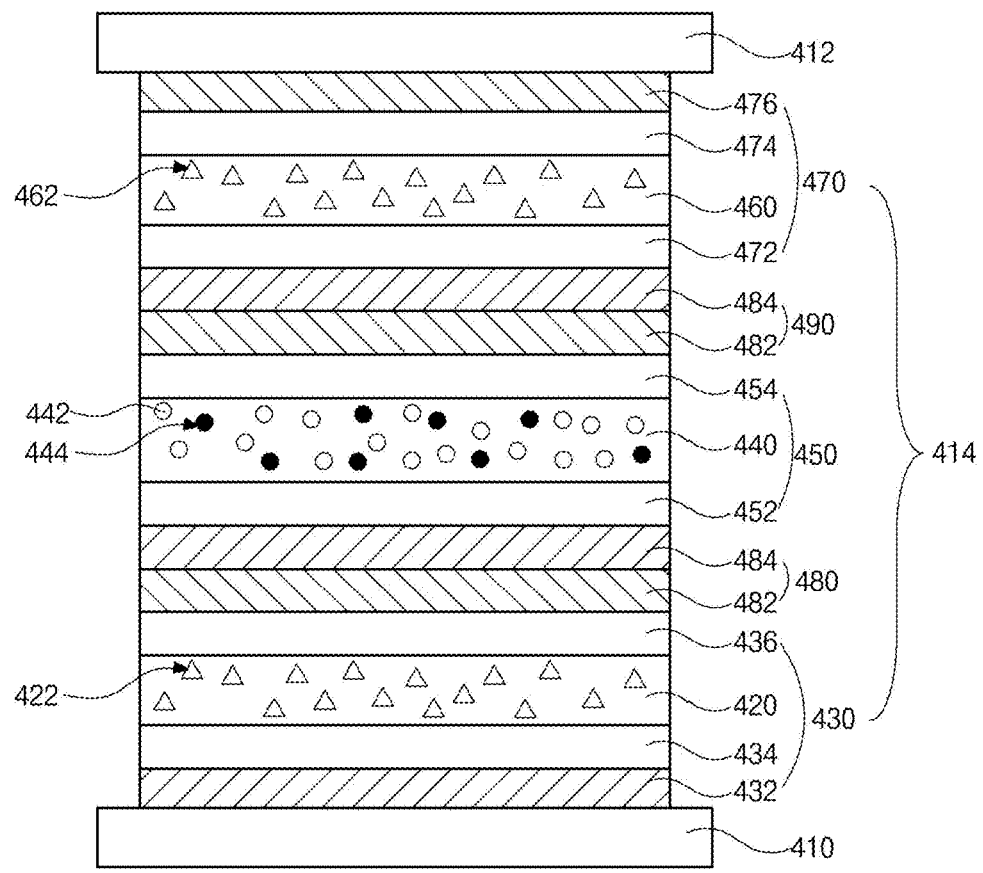
FIG. 7 is a schematic cross-sectional view of an OLED according to a third embodiment of the present disclosure.

FIG. 7 is a schematic cross-sectional view of an OLED according to a third embodiment of the present disclosure.

As shown in FIG. 7, an OLED D3 includes a first electrode 410, a second electrode 412, an organic emitting layer 414 between the first and second electrodes 410 and 412. The organic emitting layer 414 includes a first emitting part 430 including a first EML 420, a second emitting part 450 including a second EML 440 and a third emitting part 470 including a third EML 460, a first CGL 480 between the first and second emitting parts 430 and 450 and a second CGL 490 between the second and third emitting parts 450 and 470.

The first electrode 410 is the anode for injecting a hole and includes a high work function conductive material, e.g., ITO or IZO. The second electrode 412 is the cathode for injecting an electron and includes a low work function conductive material, e.g., Al, Mg or Al—Mg alloy.

The first and second CGLs 480 and 490 are positioned between the first and second emitting parts 430 and 450 and the second and third emitting parts 450 and 470, respectively. Namely, the first emitting part 430, the first CGL 480, the second emitting part 450, the second CGL 490 and the third emitting part 470 are sequentially stacked on the first electrode 410. In other words, the first emitting part 430 is positioned between the first electrode 410 and the first CGL 480, and the second emitting part 450 is positioned between the First and Second CGLs 480 and 490. In addition, the third emitting part 470 is positioned between the second electrode 412 and the second CGL 490.

The first emitting part 430 may include an HIL 432, a first HTL 434, a first EML 420 and a first ETL 436 sequentially stacked on the first electrode 410. Namely, the HIL 432 and the first HTL 434 are positioned between the first electrode 410 and the first EML 420, and the HIL 432 is positioned between the first electrode 410 and the first HTL 434. In addition, the first ETL 436 is positioned between the first EML 420 and the first CGL 480.

The first EML 420 includes a first blue dopant 422. For example, the first blue dopant 422 may be one of a fluorescent compound, a phosphorescent compound and a delayed fluorescent dopant.

Although not shown, the first EML 420 may further include a host. The blue dopant 422 may have a percentage by weight of about 1 to 40, preferably 3 to 40, with respect to the host.

The second emitting part 450 may include a second HTL 452, a second EML 440 and a second ETL 454. The second HTL 452 is positioned between the first CGL 480 and the second EML 440, and the second ETL 454 is positioned between the second EML 440 and the second CGL 490.

The second EML 440 includes a delayed fluorescent dopant 442 and a phosphorescent dopant 444.

The delayed fluorescent dopant 442 has the first emission wavelength range, and the phosphorescent dopant 444 has the second emission wavelength range being different from the first emission wavelength range. The second maximum emission wavelength is longer (greater) than the first maximum emission wavelength. For example, the first emission wavelength range may be a green wavelength range, and the second emission wavelength range may be a red wavelength range.

The delayed fluorescent dopant 442 may be represented by Formula 1 or Formula 3, and the phosphorescent dopant 444 may be represented by Formula 5.

The percentage by weight of the phosphorescent dopant 444 with respect to the delayed fluorescent dopant 442 is equal to or less than about 5. For example, the percentage by weight of the phosphorescent dopant 444 with respect to the delayed fluorescent dopant 442 may be in a range of about 0.1 to 3.33, preferably about 0.1 to 1.0.

Although not shown, the second EML 440 may further include a host. The host may have a percentage by weight of about 50 to 80 in the second EML 440 and may be represented by Formula 7-1 or Formula 7-2.

The third emitting part 470 may include a third HTL 472, a third EML 460, a third ETL 474 and an EIL 476. The third HTL 472 is positioned between the second CGL 490 and the third EML 460, and the third ETL 474 is positioned between the third EML 460 and the second electrode 412. In addition, the EIL 476 is positioned between the third ETL 474 and the second electrode 412.

The third EML 460 includes a second blue dopant 462. The second blue dopant 462 has an emission wavelength range being shorter than the delayed fluorescent dopant 442 and the phosphorescent dopant 444 in the second EML 440. For example, the second blue dopant 462 may be one of a fluorescent compound, a phosphorescent compound and a delayed fluorescent dopant.

The first blue dopant 422 and the second blue dopant 462 may be same or different.

Although not shown, the third EML 460 may further include a host. The second blue dopant 462 may have a percentage by weight of about 1 to 40, preferably 3 to 40, with respect to the host.

The first CGL 480 is positioned between the first emitting part 430 and the second emitting part 450, and the second CGL 490 is positioned between the second emitting part 450 and the third emitting part 470. Namely, the first and second emitting parts 430 and 450 are connected to each other by the first CGL 480, and the second and third emitting parts 450 and 470 are connected to each other by the second CGL 490. Each of the first and second CGLs 480 and 490 may be a P-N junction type CGL. The first CGL 480 includes an N-type CGL 482 and a P-type CGL 484, and the second CGL 490 includes an N-type CGL 492 and a P-type CGL 494.

In the first CGL 480, the N-type CGL 482 is positioned between the first ETL 436 and the second HTL 452, and the P-type CGL 484 is positioned between the N-type CGL 482 and the second HTL 452.

In the second CGL 490, the N-type CGL 492 is positioned between the second ETL 454 and the third HTL 472, and the P-type CGL 494 is positioned between the N-type CGL 492 and the third HTL 472.

In the OLED D3, the second EML 440 in the second emitting part 450 includes the delayed fluorescent dopant 442 as a green dopant and the phosphorescent dopant 444 as a red dopant, and the percentage by weight of the phosphorescent dopant 444 with respect to the delayed fluorescent dopant 442 is equal to or less than about 5, preferably 3.33. As a result, the light of a red wavelength range and the light of a green wavelength range are provided from the second emitting part 450.

Accordingly, the OLED D3 including the second emitting part 450, the first emitting part 430, which includes the first blue dopant 422, and the third emitting part 470, which includes the second blue dopant 462, emits the white light.

In addition, since the first and third emitting parts 430 and 470 respectively include the first and third EMLs 420, 460, which respectively include the first and second blue dopants 422 and 462, the color temperature of the OLED D3 is improved.

Figure 8:
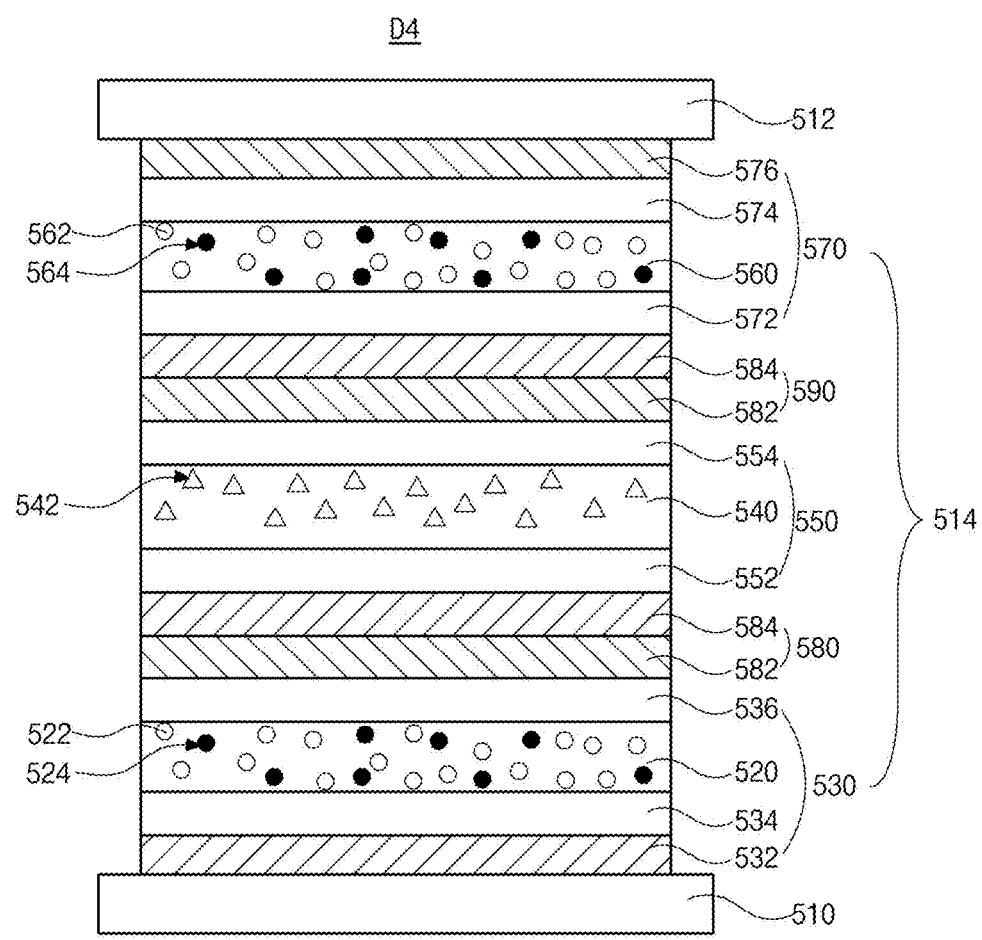
FIG. 8 is a schematic cross-sectional view of an OLED according to a fourth embodiment of the present disclosure.

FIG. 8 is a schematic cross-sectional view of an OLED according to a fourth embodiment of the present disclosure.

As shown in FIG. 8, an OLED D4 includes a first electrode 510, a second electrode 512, an organic emitting layer 514 between the first and second electrodes 510 and 512. The organic emitting layer 514 includes a first emitting part 530 including a first EML 520, a second emitting part 550 including a second EML 540 and a third emitting part 570 including a third EML 560, a first CGL 580 between the first and second emitting parts 530 and 550 and a second CGL 590 between the second and third emitting parts 550 and 570.

The first electrode 510 is the anode for injecting a hole and includes a high work function conductive material, e.g., ITO or IZO. The second electrode 512 is the cathode for injecting an electron and includes a low work function conductive material, e.g., Al, Mg or Al—Mg alloy.

The first and second CGLs 580 and 590 are positioned between the first and second emitting parts 530 and 550 and the second and third emitting parts 550 and 570, respectively. Namely, the first emitting part 530, the first CGL 580, the second emitting part 550, the second CGL 590 and the third emitting part 570 are sequentially stacked on the first electrode 510. In other words, the first emitting part 530 is positioned between the first electrode 510 and the first CGL 580, and the second emitting part 550 is positioned between the First and Second CGLs 580 and 590. In addition, the third emitting part 570 is positioned between the second electrode 512 and the second CGL 590.

The first emitting part 530 may include an HIL 532, a first HTL 534, a first EML 520 and a first ETL 536 sequentially stacked on the first electrode 510. Namely, the HIL 532 and the first HTL 534 are positioned between the first electrode 510 and the first EML 520, and the HIL 532 is positioned between the first electrode 510 and the first HTL 534. In addition, the first ETL 536 is positioned between the first EML 520 and the first CGL 580.

The first EML 520 includes a first delayed fluorescent dopant 522 and a first phosphorescent dopant 524.

The first delayed fluorescent dopant 522 has the first emission wavelength range, and the first phosphorescent dopant 524 has the second emission wavelength range being different from the first emission wavelength range. The second maximum emission wavelength is longer (greater) than the first maximum emission wavelength. For example, the first emission wavelength range may be a green wavelength range, and the second emission wavelength range may be a red wavelength range.

The first delayed fluorescent dopant 522 may be represented by Formula 1 or Formula 3, and the first phosphorescent dopant 524 may be represented by Formula 5.

The percentage by weight of the first phosphorescent dopant 524 with respect to the first delayed fluorescent dopant 522 is equal to or less than about 5. For example, the percentage by weight of the first phosphorescent dopant 524 with respect to the first delayed fluorescent dopant 522 may be in a range of about 0.1 to 3.33, preferably about 0.1 to 1.0.

Although not shown, the first EML 540 may further include a host. The host may have a percentage by weight of about 50 to 80 in the first EML 520 and may be represented by Formula 7-1 or Formula 7-2.

The second emitting part 550 may include a second HTL 552, a second EML 540 and a second ETL 554. The second HTL 552 is positioned between the first CGL 580 and the second EML 540, and the second ETL 554 is positioned between the second EML 540 and the second CGL 590.

The second EML 540 includes a blue dopant 542. The blue dopant 542 has an emission wavelength range being shorter than the first delayed fluorescent dopant 522 and the first phosphorescent dopant 524 in the first EML 520. For example, the blue dopant 542 may be one of a fluorescent compound, a phosphorescent compound and a delayed fluorescent dopant.

Although not shown, the second EML 520 may further include a host. The blue dopant 542 may have a percentage by weight of about 1 to 40, preferably 3 to 40, with respect to the host.

The third emitting part 570 may include a third HTL 572, a third EML 560, a third ETL 574 and an EIL 576. The third HTL 572 is positioned between the second CGL 590 and the third EML 560, and the third ETL 574 is positioned between the third EML 560 and the second electrode 512. In addition, the EIL 576 is positioned between the third ETL 574 and the second electrode 512.

The third EML 560 includes a second delayed fluorescent dopant 562 and a second phosphorescent dopant 564.

The second delayed fluorescent dopant 562 has the first emission wavelength range, and the second phosphorescent dopant 564 has the second emission wavelength range being different from the first emission wavelength range. The second maximum emission wavelength is longer (greater) than the first maximum emission wavelength. For example, the first emission wavelength range may be a green wavelength range, and the second emission wavelength range may be a red wavelength range.

The second delayed fluorescent dopant 562 may be represented by Formula 1 or Formula 3, and the second phosphorescent dopant 564 may be represented by Formula 5.

The percentage by weight of the second phosphorescent dopant 564 with respect to the second delayed fluorescent dopant 562 is equal to or less than about 5. For example, the percentage by weight of the second phosphorescent dopant 564 with respect to the second delayed fluorescent dopant 562 may be in a range of about 0.1 to 3.33, preferably about 0.1 to 1.0.

Although not shown, the third EML 560 may further include a host. The host may have a percentage by weight of about 50 to 80 in the third EML 560 and may be represented by Formula 7-1 or Formula 7-2. The host of the first EML 520 and the host of the third EML 560 may be same or different.

The first CGL 580 is positioned between the first emitting part 530 and the second emitting part 550, and the second CGL 590 is positioned between the second emitting part 550 and the third emitting part 570. Namely, the first and second emitting parts 530 and 550 are connected to each other by the first CGL 580, and the second and third emitting parts 550 and 570 are connected to each other by the second CGL 590. Each of the first and second CGLs 580 and 590 may be a P-N junction type CGL. The first CGL 580 includes an N-type CGL 582 and a P-type CGL 584, and the second CGL 590 includes an N-type CGL 592 and a P-type CGL 594.

In the first CGL 580, the N-type CGL 582 is positioned between the first ETL 536 and the second HTL 552, and the P-type CGL 584 is positioned between the N-type CGL 582 and the second HTL 552.

In the second CGL 590, the N-type CGL 592 is positioned between the second ETL 554 and the third HTL 572, and the P-type CGL 594 is positioned between the N-type CGL 592 and the third HTL 572.

In the OLED D4, the first EML 520 in the first emitting part 530 and the third EML 560 in the third emitting part 570 include the delayed fluorescent dopants 522 and 562 as a green dopant and the phosphorescent dopants 524 and 564 as a red dopant, and the percentage by weight of each of the phosphorescent dopants 524 and 564 with respect to each of the delayed fluorescent dopants 522 and 562 is equal to or less than about 5, preferably 3.33. As a result, the light of a red wavelength range and the light of a green wavelength range are provided from each of the first and third emitting parts 530 and 570.

Accordingly, the OLED D4 including the first and third emitting parts 530 and 570 and the second emitting part 550, which includes the blue dopant 542, emits the white light.

In addition, since both of the first and third emitting parts 530 and 570 emit the red light and the green light, the OLED D4 has the color temperature adequate to the lighting device. The OLED D4 is also available to the display device.

It will be apparent to those skilled in the art that various modifications and variations can be made in the present disclosure without departing from the spirit or scope of the disclosure. Thus, it is intended that the present disclosure cover the modifications and variations of this invention provided they come within the scope of the appended claims and their equivalents.

What is claimed is:

1. An organic light emitting diode, comprising:
   a first electrode;
   a second electrode facing the first electrode; and
   a first emitting material layer disposed between the first and second electrodes and includes a host, a first delayed fluorescent dopant and a first phosphorescent dopant,
   wherein a percentage by weight of the first phosphorescent dopant with respect to the first delayed fluorescent dopant is equal to or less than 5.

2. The organic light emitting diode according to claim 1, wherein the first delayed fluorescent dopant has a first maximum emission wavelength, and the first phosphorescent dopant has a second maximum emission wavelength, and
   wherein the second maximum emission wavelength is longer than the first maximum emission wavelength.

3. The organic light emitting diode according to claim 2, wherein the percentage by weight of the first phosphorescent dopant with respect to the first delayed fluorescent dopant is in a range of 0.1 to 3.33.

4. The organic light emitting diode according to claim 3, wherein the percentage by weight of the first phosphorescent dopant with respect to the first delayed fluorescent dopant is in a range of 0.1 to 1.0.

5. The organic light emitting diode according to claim 1, wherein the first delayed fluorescent dopant is represented by Formula 1:

[Formula 1]

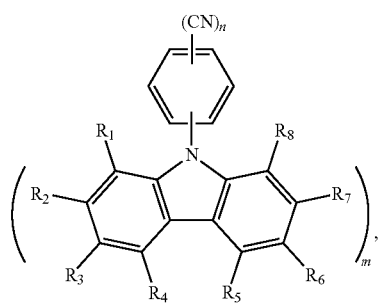

wherein each of $R_1$ to $R_8$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl, and amine, and
wherein m is an integer of 2 to 5, n is an integer of 1 to 3, and m+n is less than or equal to 6.

6. The organic light emitting diode according to claim 5, wherein the first delayed fluorescent dopant is selected from Formula 2:

[Formula 2]

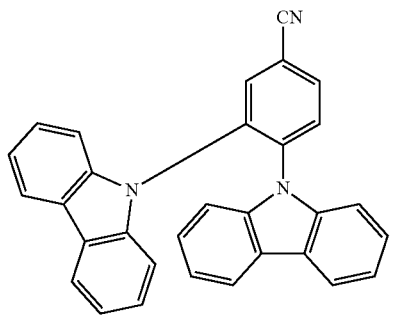

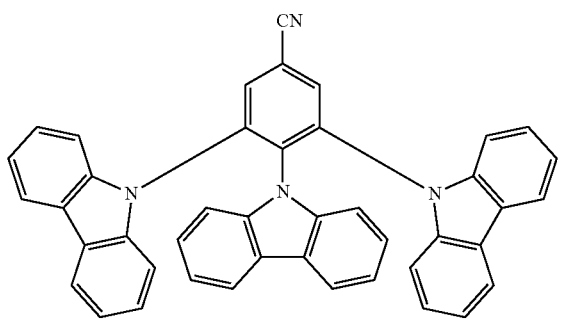

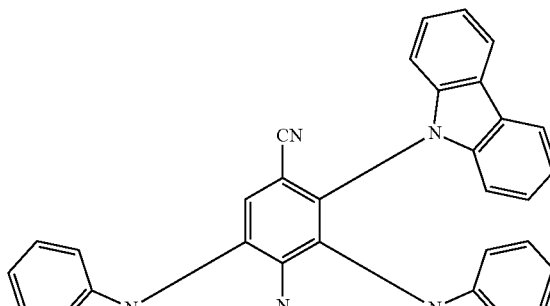

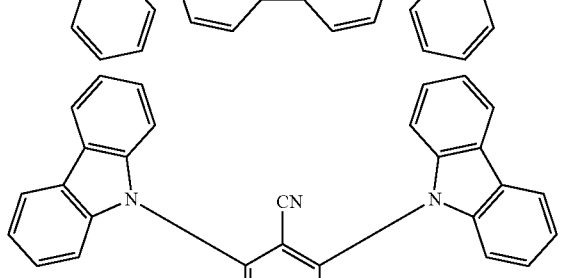

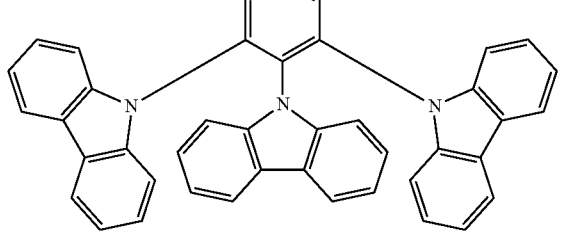

-continued

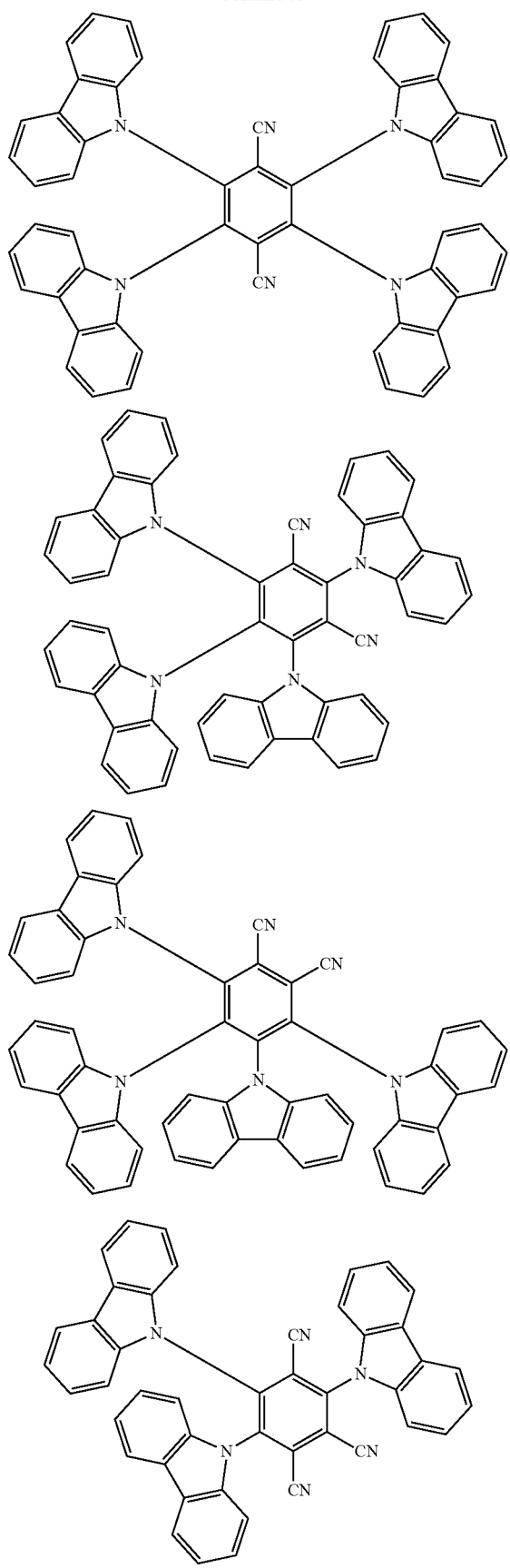

-continued

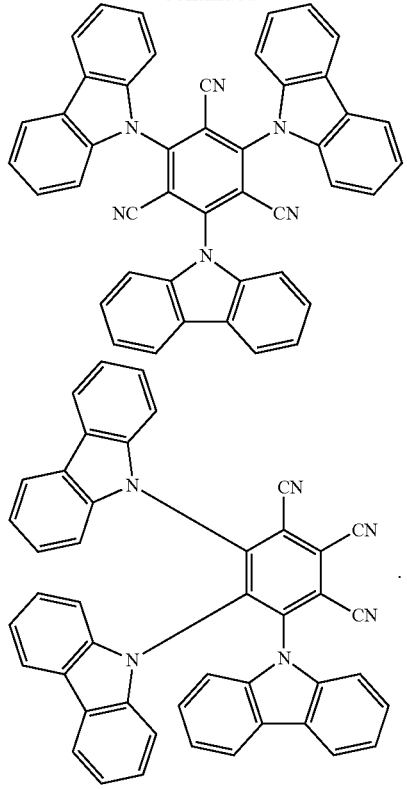

7. The organic light emitting diode according to claim 1, wherein the first delayed fluorescent dopant is represented by Formula 3-1:

[Formula 3-1]

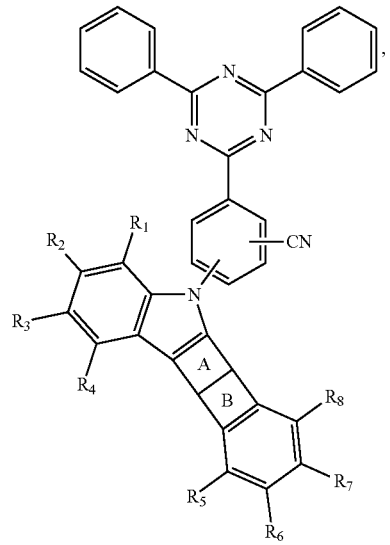

wherein each of $R_1$ to $R_8$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine, wherein A and B are respectively represented by Formulas 3-2 and 3-3:

[Formula 3-2]
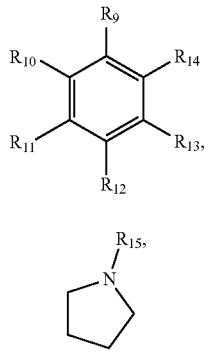
[Formula 3-3]
and
wherein each of $R_9$ to $R_{15}$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine.
8. The organic light emitting diode according to claim 7, wherein the first delayed fluorescent dopant is selected from Formula 4:
[Formula 4]
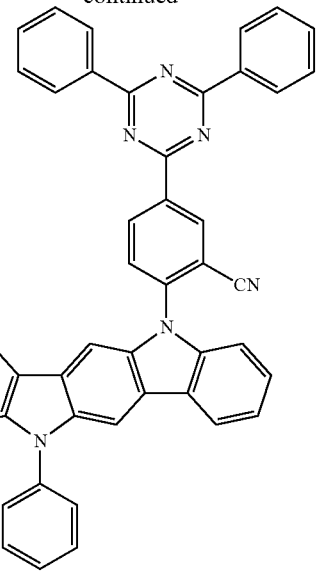
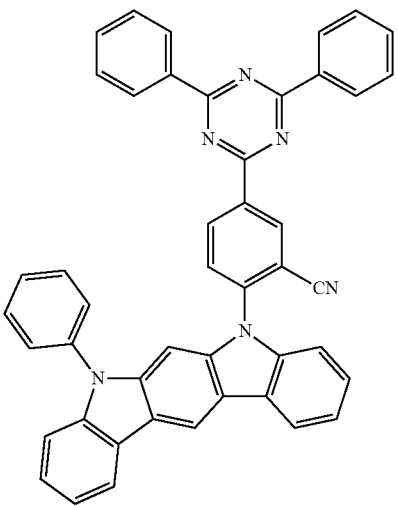
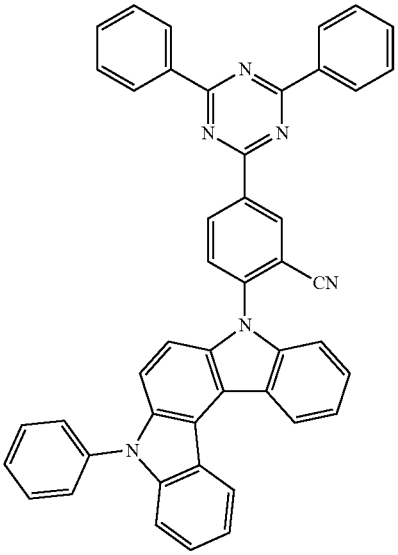

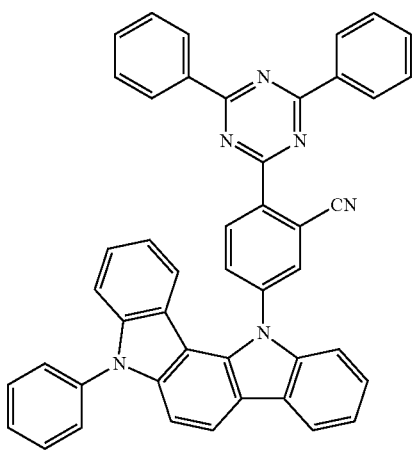

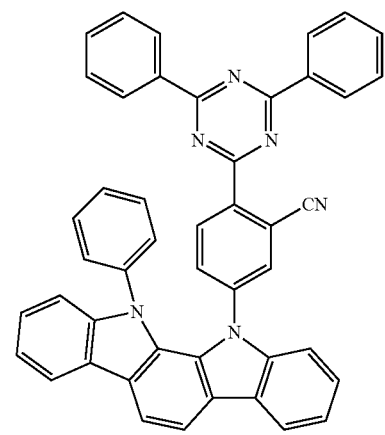

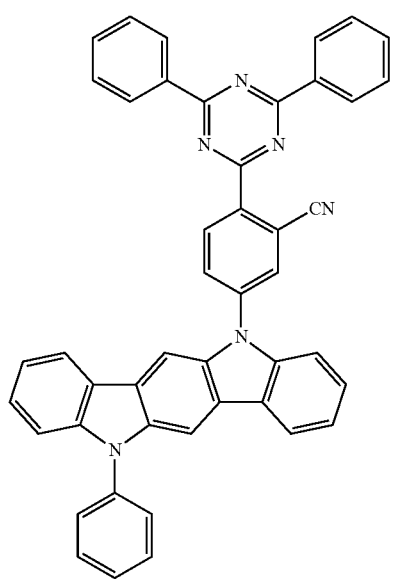

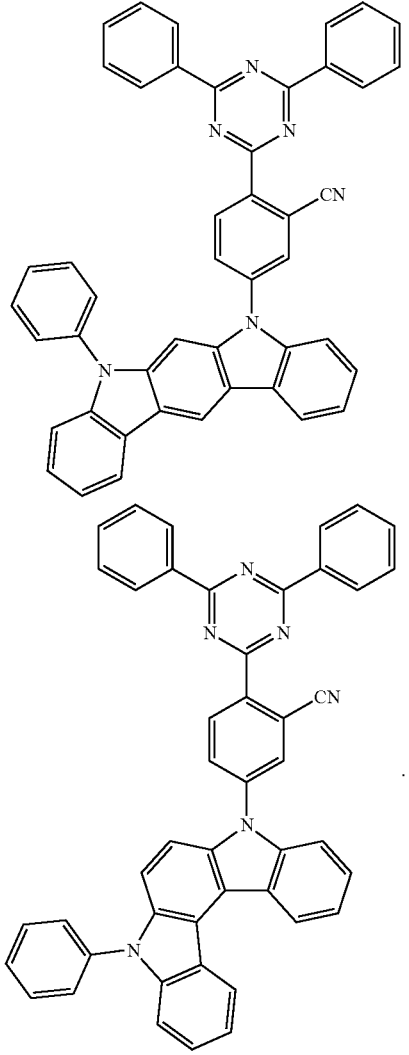

9. The organic light emitting diode according to claim 1, wherein the first phosphorescent dopant is represented by Formula 5:

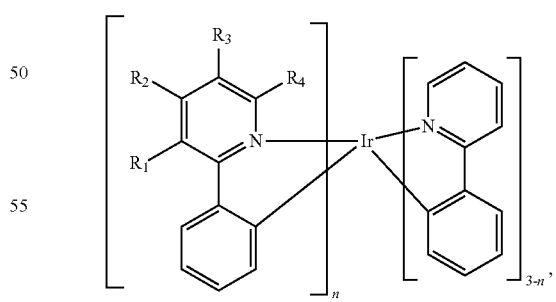

wherein each of $R_1$ to $R_4$ is independently selected from the group consisting of hydrogen, $C_1$-$C_{20}$ alkyl, $C_1$-$C_{20}$ alkoxy, $C_1$ to $C_{20}$ alkylsilyl, $C_6$-$C_{30}$ aryl, $C_5$-$C_{30}$ heteroaryl and amine, wherein $R_1$ and $R_2$, $R_2$ and $R_3$ or $R_3$ and $R_4$ are combined to form a fused $C_6$-$C_{30}$ aromatic ring, and wherein n is an integer of 1 to 3.

10. The organic light emitting diode according to claim 9, wherein the first phosphorescent dopant is selected from Formula 6:

[Formula 6]

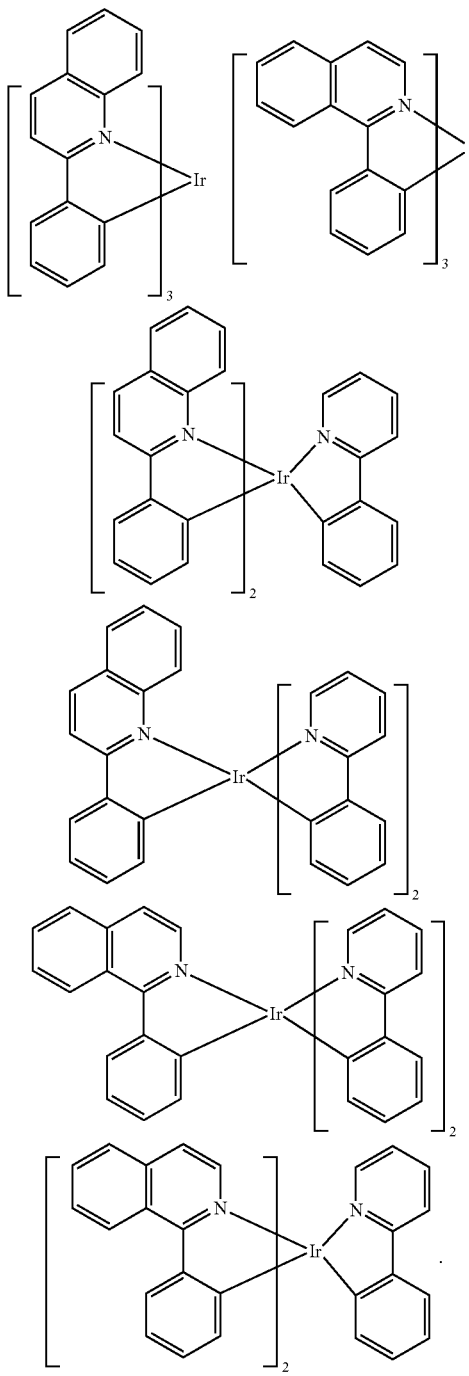

11. The organic light emitting diode according to claim 1, wherein with respect to the host, the first delayed fluorescent dopant has a percentage by weight of 20 to 70, and the first phosphorescent dopant has a percentage by weight of 0.1 to 2.

12. The organic light emitting diode according to claim 1, wherein the host is represented by Formulas 7-1 or 7-2,

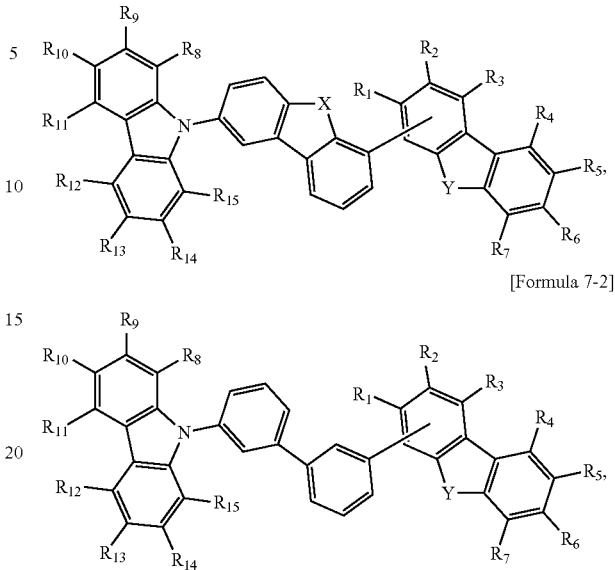

[Formula 7-1]

[Formula 7-2]

wherein in Formula 7-1, X is O, S or NR, and R is $C_6$-$C_{30}$ aryl group, wherein in Formulas 7-1 and 7-2, Y is O or S, and wherein in Formulas 7-1 and 7-2, each of $R_1$ to $R_{15}$ is independently selected from the group consisting of hydrogen, $C_1$-$C_{20}$ alkyl, $C_1$-$C_{20}$ alkoxy, $C_1$ to $C_{20}$ alkyl-silyl, $C_6$-$C_{30}$ aryl, $C_5$-$C_{30}$ heteroaryl and amine.

13. The organic light emitting diode according to claim 12, wherein the host is selected from Formula 8:

[Formula 8]

41
-continued
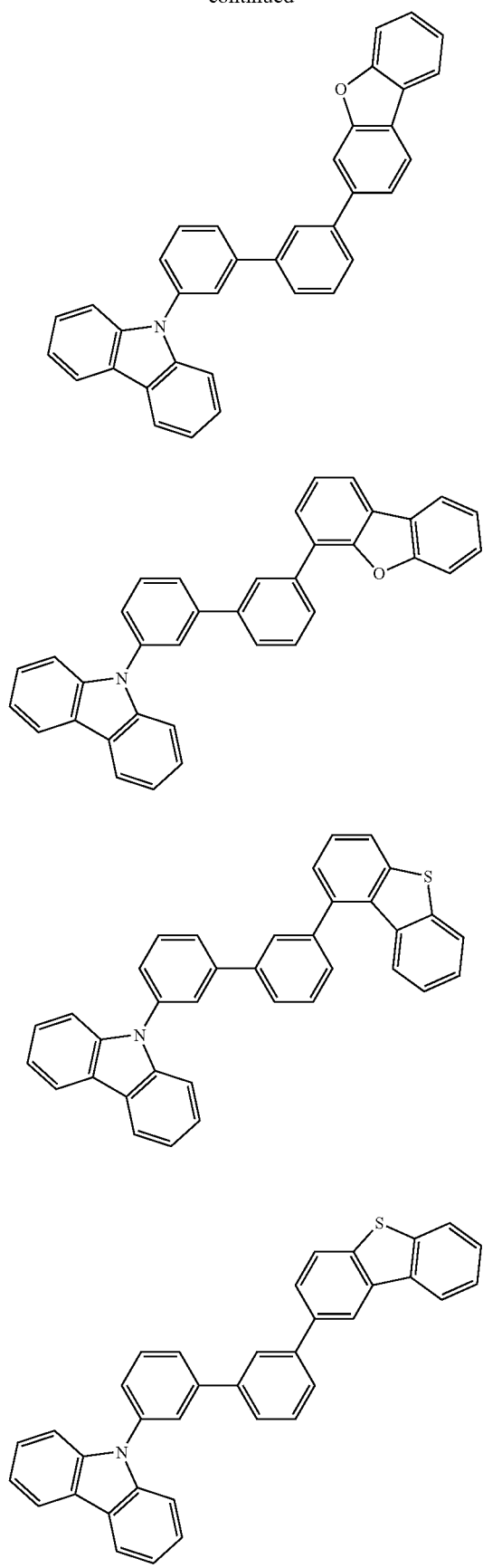
42
-continued
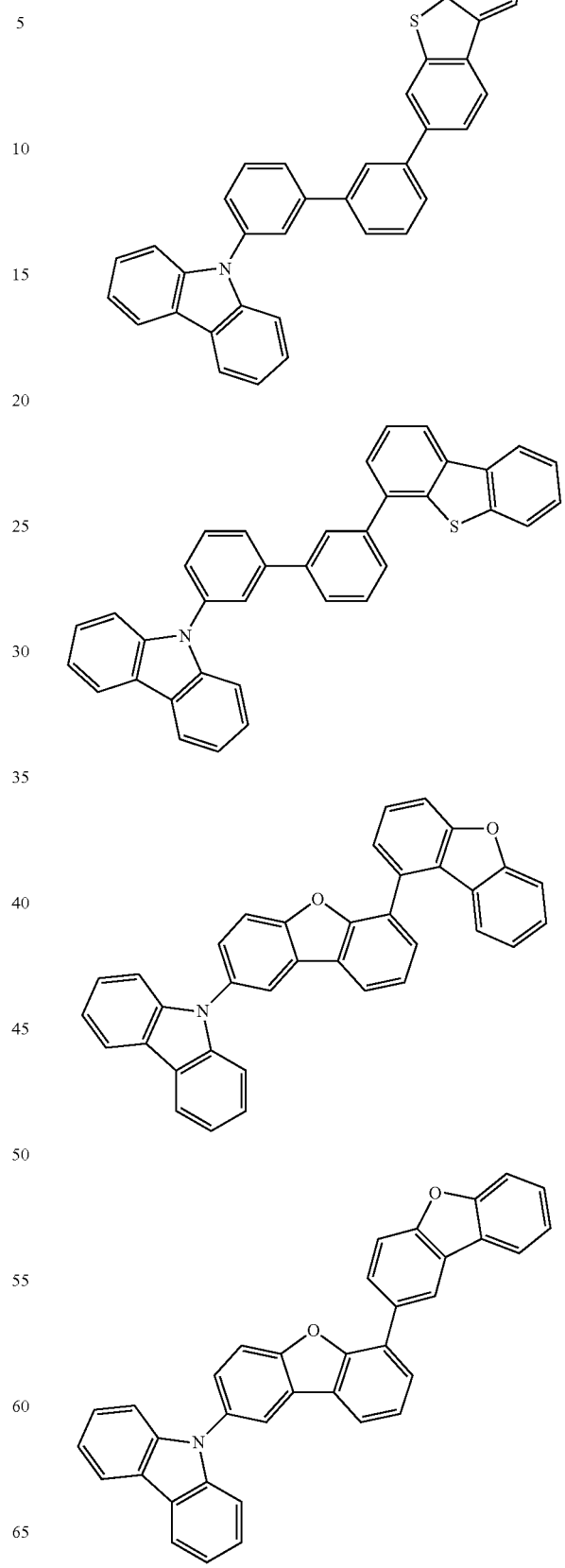

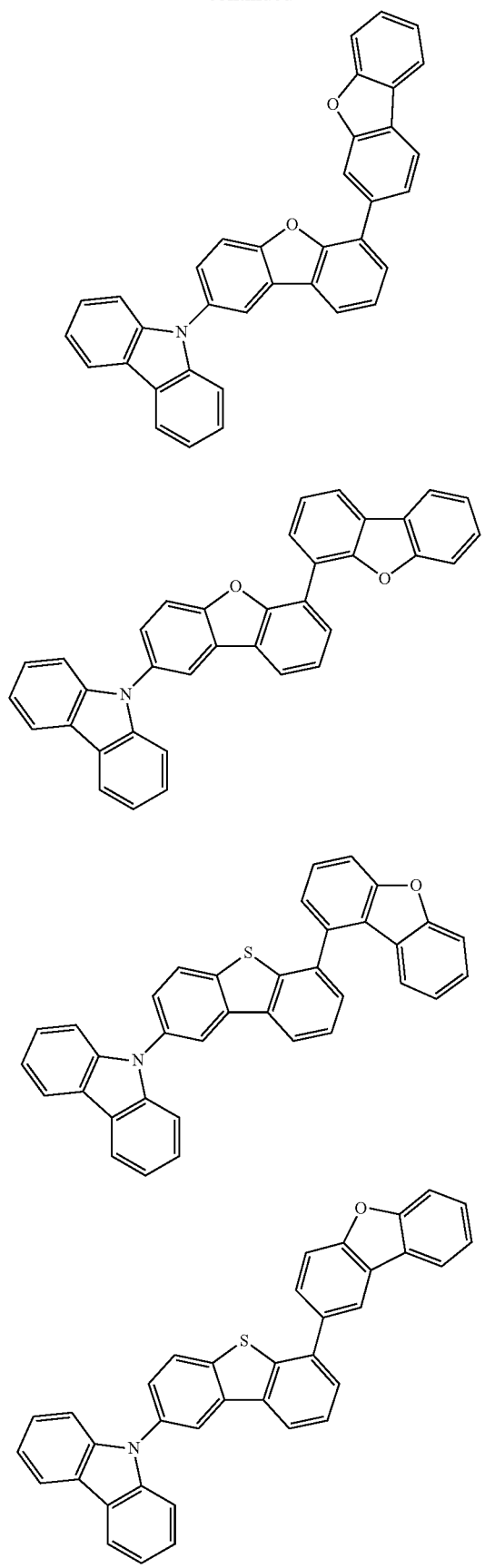
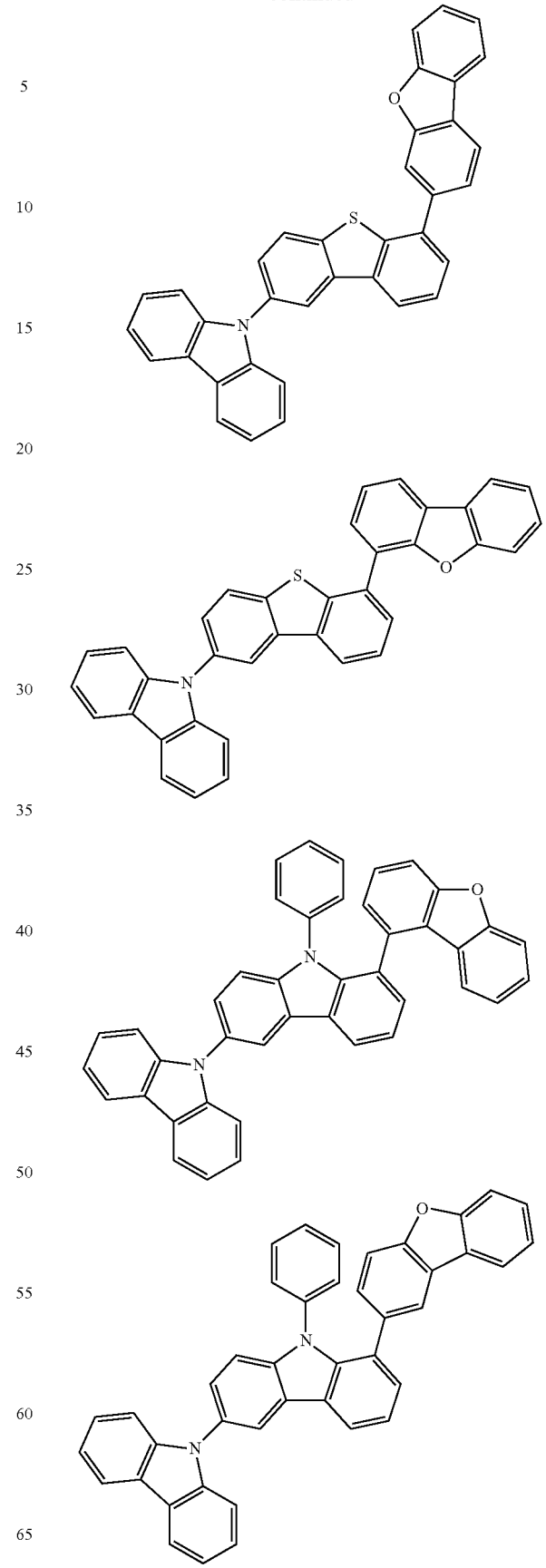

-continued

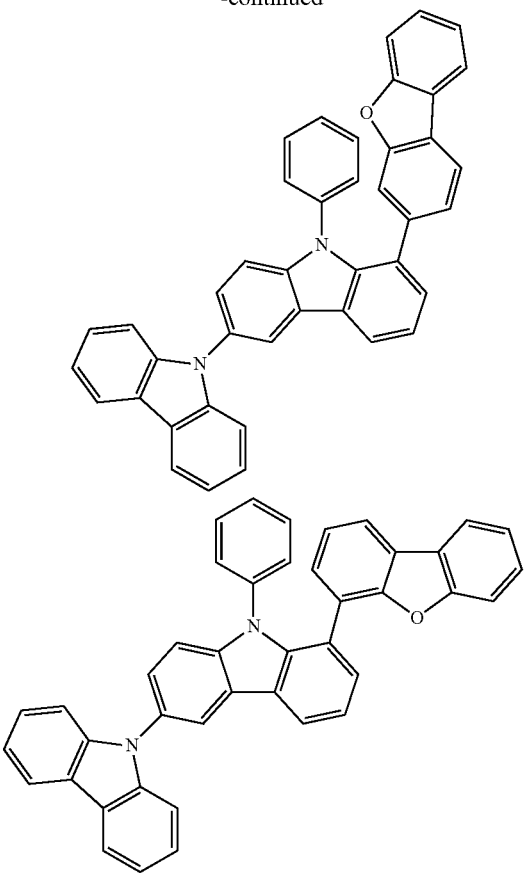

14. The organic light emitting diode according to claim 1, further comprising:
a second emitting material layer including a first blue dopant and disposed between the first emitting material layer and the second electrode; and
a first charge generation layer between the first and second emitting material layers.

15. The organic light emitting diode according to claim 14, further comprising:
a third emitting material layer including a second blue dopant and disposed between the first electrode and the first emitting material layer; and
a second charge generation layer between the first and third emitting material layers.

16. The organic light emitting diode according to claim 14, further comprising:
a third emitting material layer including a second delayed fluorescent dopant and a second phosphorescent dopant and disposed between the second emitting material layer and the second electrode; and
a second charge generation layer between the second and third emitting material layers.

17. The organic light emitting diode according to claim 16, wherein the percentage by weight of the second phosphorescent dopant with respect to the second delayed fluorescent dopant is in a range of 0.1 to 3.33.

18. An organic light emitting display device, comprising:
a substrate;
an organic light emitting diode on or over the substrate and including:
  a first electrode;
  a second electrode facing the first electrode; and
  a first emitting material layer disposed between the first and second electrodes and includes a host, a first delayed fluorescent dopant and a first phosphorescent dopant; and
a thin film transistor disposed between the substrate and the organic light emitting diode and connected to the organic light emitting diode,
wherein a percentage by weight of the first phosphorescent dopant with respect to the first delayed fluorescent dopant is equal to or less than 5.

19. A lighting device, comprising:
a substrate; and
an organic light emitting diode on or over the substrate and including:
  a first electrode;
  a second electrode facing the first electrode; and
  a first emitting material layer disposed between the first and second electrodes and includes a host, a first delayed fluorescent dopant and a first phosphorescent dopant,
wherein a percentage by weight of the first phosphorescent dopant with respect to the first delayed fluorescent dopant is equal to or less than 5.

* * * * *